United States Patent
Hong et al.

(10) Patent No.: US 9,541,786 B2
(45) Date of Patent: Jan. 10, 2017

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Seok-Joon Hong, Seongnam-si (KR); Ji Seong Yang, Seoul (KR); Tae Woo Lim, Yongin-si (KR); Seon Uk Lee, Seongnam-si (KR); Kyung Tae Chae, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/603,082

(22) Filed: Jan. 22, 2015

(65) Prior Publication Data

US 2015/0234214 A1    Aug. 20, 2015

(30) Foreign Application Priority Data

Feb. 17, 2014  (KR) .................. 10-2014-0018048
May 14, 2014  (KR) .................. 10-2014-0057674
Dec. 23, 2014  (KR) .................. 10-2014-0187158

(51) Int. Cl.
*H01L 21/46* (2006.01)
*G02F 1/1334* (2006.01)
(Continued)

(52) U.S. Cl.
CPC ........... *G02F 1/1334* (2013.01); *G02F 1/1341* (2013.01); *G02F 1/1368* (2013.01);
(Continued)

(58) Field of Classification Search
CPC .. C21D 6/007; G02F 1/133345; G02F 1/1334; G02F 1/1341; G02F 1/1368; H01L 27/124; H01L 27/1259
(Continued)

(56) References Cited

U.S. PATENT DOCUMENTS

2004/0041147 A1    3/2004  Park
2012/0062448 A1*   3/2012  Kim .................. G02F 1/133377
                                                        345/55
(Continued)

FOREIGN PATENT DOCUMENTS

CN      103424939 A    12/2013
JP      2013-242556    12/2013
(Continued)

OTHER PUBLICATIONS

European Search Report, EP Application No. 15155167.8, May 28, 2015, 9 pages.
(Continued)

*Primary Examiner* — Mohammed Shamsuzzaman
(74) *Attorney, Agent, or Firm* — Innovation Counsel LLP

(57) ABSTRACT

A liquid crystal display includes: a substrate; a thin film transistor; a pixel electrode; a roof layer; a liquid crystal layer; and a plurality of partitions. The thin film transistor is disposed on the substrate. The pixel electrode is connected to the thin film transistor. The roof layer is disposed to face the pixel electrode. The liquid crystal layer is formed by a plurality of microcavities between the pixel electrode and the roof layer, wherein the microcavities include a liquid crystal material. The partitions are between the microcavities adjacent to each other, wherein the partitions may include an organic material and are arranged side by side to one another.

9 Claims, 39 Drawing Sheets

(51) Int. Cl.
  *H01L 27/12* (2006.01)
  *G02F 1/1333* (2006.01)
  *G02F 1/1368* (2006.01)
  *G02F 1/1341* (2006.01)
(52) U.S. Cl.
  CPC ...... *G02F 1/133345* (2013.01); *H01L 27/124* (2013.01); *H01L 27/1259* (2013.01)
(58) Field of Classification Search
  USPC ... 438/458; 257/72; 349/43, 86, 42, 89, 139, 349/12; 345/55
  See application file for complete search history.

(56) References Cited

U.S. PATENT DOCUMENTS

| | | | |
|---|---|---|---|
| 2013/0250220 A1 | 9/2013 | Kim et al. | |
| 2013/0308071 A1 | 11/2013 | Kim et al. | |
| 2013/0321734 A1 | 12/2013 | Won et al. | |
| 2013/0335664 A1* | 12/2013 | Shim | G02F 1/1339 349/43 |
| 2014/0009712 A1 | 1/2014 | Minowa | |
| 2014/0111746 A1 | 4/2014 | Kim et al. | |
| 2014/0267966 A1* | 9/2014 | Won | G02F 1/133377 349/42 |
| 2014/0293193 A1* | 10/2014 | Lim | G02F 1/1341 349/86 |
| 2014/0293205 A1 | 10/2014 | Kim et al. | |
| 2014/0346504 A1 | 11/2014 | Misaki | |
| 2014/0354921 A1 | 12/2014 | Lee et al. | |
| 2014/0354922 A1 | 12/2014 | Sung et al. | |
| 2015/0015824 A1* | 1/2015 | Lee | H01L 27/1259 349/43 |
| 2015/0070631 A1* | 3/2015 | Prushinskiy | G02F 1/133377 349/89 |
| 2015/0092131 A1* | 4/2015 | Lee | G02F 1/1337 349/43 |
| 2016/0116794 A1* | 4/2016 | Song | G02F 1/133345 349/43 |
| 2016/0170254 A1 | 6/2016 | Chae et al. | |

FOREIGN PATENT DOCUMENTS

| | | |
|---|---|---|
| KR | 1020030082144 A | 10/2003 |
| KR | 1020130129008 A | 11/2013 |
| KR | 1020140112288 A | 9/2014 |

OTHER PUBLICATIONS

Hong et al., U.S. Appl. No. 14/456,247, filed Aug. 11, 2014, titled "Liquid Crystal Display and Method of Manufacturing the Same".

Yang et al., U.S. Appl. No. 14/505,404, filed Oct. 2, 2014, titled "Liquid Crystal Display and Method of Manufacturing the Same".

* cited by examiner

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2014-0018048 filed on Feb. 17, 2014, Korean Patent Application No. 10-2014-0057674 filed on May 14, 2014, and Korean Patent Application No. 10-2014-0187158 filed on Dec. 23, 2014 in the Korean Intellectual Property Office, the entire contents of which are incorporated herein by reference.

BACKGROUND (a) Field

The present application relates to a liquid crystal display and a manufacturing method thereof.

(b) Description of the Related Art

A liquid crystal display panel, which is one of the more common types of flat panel displays currently in use, includes two sheets of substrates with field generating electrodes such as a pixel electrode and a common electrode, and a liquid crystal layer interposed therebetween.

The liquid crystal display generates electric fields in the liquid crystal layer by applying voltages to the field generating electrodes, determines the alignment of liquid crystal molecules of the liquid crystal layer by the generated electric field, and controls polarization of incident light, thereby displaying images.

A technique of forming a cavity in a pixel and filling the cavity with liquid crystal molecules to implement a display has been developed for one of the liquid crystal displays. Although two sheets of substrates are used in a conventional liquid crystal display, this technique forms constituent elements on one substrate, thereby reducing weight, thickness, and the like of the device.

In the display device including a plurality of microcavities, a roof layer to maintain the microcavities is formed. The roof layer may be continuously connected between adjacent microcavities. The roof layer may be formed of a composite layer of an inorganic layer and an organic layer.

Like this, when the roof layer is formed of the composite layer of the inorganic layer and the organic layer, a process time is increased due to an increase of a number of masks. Also, since it is necessary to increase an alignment margin by considering a misalignment between the organic layer and the inorganic layer, the aperture ratio may be deteriorated.

The above information disclosed in this Background section is only for enhancement of understanding of the background and therefore it may contain information that does not form the prior art that is already known in this country to a person of ordinary skill in the art.

SUMMARY

Embodiments provide a liquid crystal display in which a process time is reduced and an aperture ratio is improved, and a manufacturing method thereof.

A liquid crystal display according to an exemplary embodiment includes: a substrate; a thin film transistor; a pixel electrode; a roof layer; a liquid crystal layer; and a plurality of partitions. The thin film transistor is disposed on the substrate. The pixel electrode is connected to the thin film transistor. The roof layer is disposed to face the pixel electrode. The liquid crystal layer is formed by a plurality of microcavities between the pixel electrode and the roof layer, wherein the microcavities include a liquid crystal material. The partitions are between the microcavities adjacent to each other, wherein the partitions may include an organic material and are arranged side by side to one another.

The roof layer may be disposed on the partitions.

An insulating layer disposed under the roof layer may be further included, and the partitions may be disposed between the insulating layer and the roof layer.

The roof layer and the insulating layer may include an inorganic material.

The roof layer may contact the insulating layer in a region corresponding to the microcavities.

A capping layer disposed on a liquid crystal injection portion may be further included, and the liquid crystal injection portion may be formed between the microcavities.

A common electrode disposed under the insulating layer and facing the pixel electrode with respect to the microcavities may be further included, and a lateral wall of the common electrode and a lateral wall of the insulating layer may be aligned at the liquid crystal injection portion.

A data line connected to the thin film transistor may be further included, and the partitions may extend in a direction parallel to the data line.

The partitions may be disconnected according to the direction of the data line.

A gate line disposed on the substrate and crossing the data line may be further included, and the partitions may not cross the gate line.

The partitions may have a bar shape.

A manufacturing method of a liquid crystal display according to an exemplary embodiment includes the following. A thin film transistor is formed on a substrate. A pixel electrode connected to the thin film transistor is formed. A sacrificial layer is formed on the pixel electrode. An insulating layer is formed on the sacrificial layer. An organic layer is formed on the insulating layer, and the insulating layer is patterned by using the organic layer as a mask. The sacrificial layer is removed to form a plurality of microcavities. The organic layer is patterned. A liquid crystal material is injected to the microcavities, wherein the patterning of the organic layer includes removing the organic layer disposed at a portion corresponding to each of the microcavities and forming a plurality of partitions between the microcavities adjacent to each other.

The partitions may include organic material and are arranged side by side to one another.

The forming of the sacrificial layer may include forming an opening at a portion overlapping a data line connected to the thin film transistor.

The insulating layer may be formed in the opening.

The partitions may be formed along a direction that the opening extends.

The method may further include forming a roof layer on the insulating layer after patterning the organic layer.

The partitions may be formed between the roof layer and the insulating layer.

The roof layer and the insulating layer may include an inorganic material.

The roof layer may contact the insulating layer in a region corresponding to the microcavities.

The method may further include forming a capping layer in a liquid crystal injection portion, and the liquid crystal injection portion may be formed between the microcavities.

The method may further include forming a common electrode under the insulating layer and facing the pixel electrode with respect to the microcavities, and the common electrode may be patterned by using the organic layer as a mask.

According to an exemplary embodiment, an additional inorganic insulating layer may be omitted on the roof layer including the organic material such that a number of masks may be reduced.

Also, transmittance and an aperture ratio may be improved by simplifying a structure of the roof layer.

Further, in the manufacturing process, the organic layer is coated on the inorganic insulating layer such that damage to the inorganic layer may be prevented.

According to the exemplary embodiments, a process can be simplified by forming a roof layer only with one or more inorganic layers. In addition, when the roof layer is formed with inorganic layers, each having a different stress, the roof layer is prevented from being lifted around an entrance portion.

DETAILED DESCRIPTION OF THE EMBODIMENTS

Figure 1:
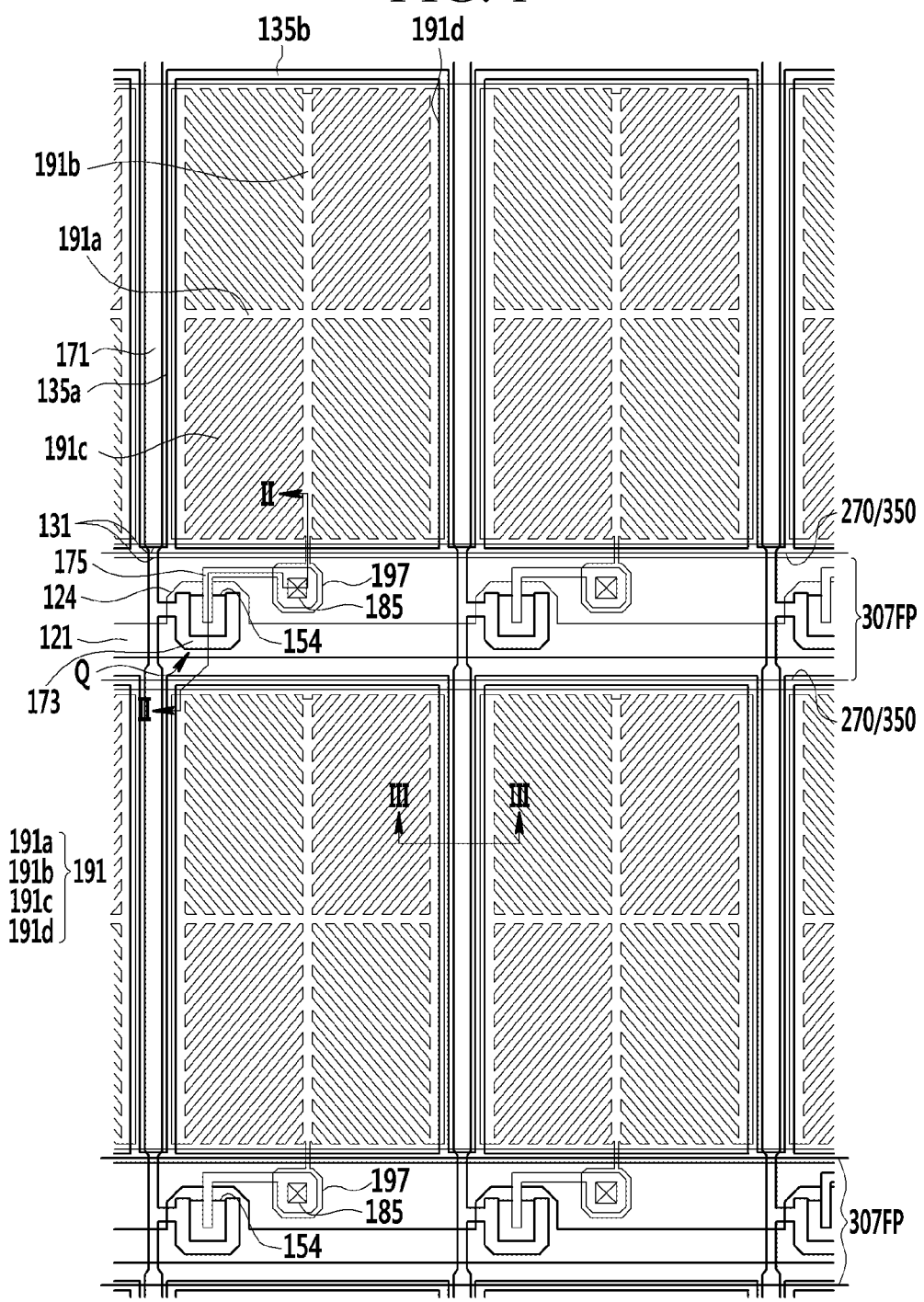
FIG. 1 is a top plan view of a liquid crystal display according to an exemplary embodiment.

Exemplary embodiments will be described in detail with reference to the attached drawings. The embodiments may be modified in many different forms and should not be construed as being limited to the exemplary embodiments set forth herein. Rather, the exemplary embodiments are provided so that this disclosure will be thorough and complete, and will fully convey the concept of the inventive concept to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

Figure 2:
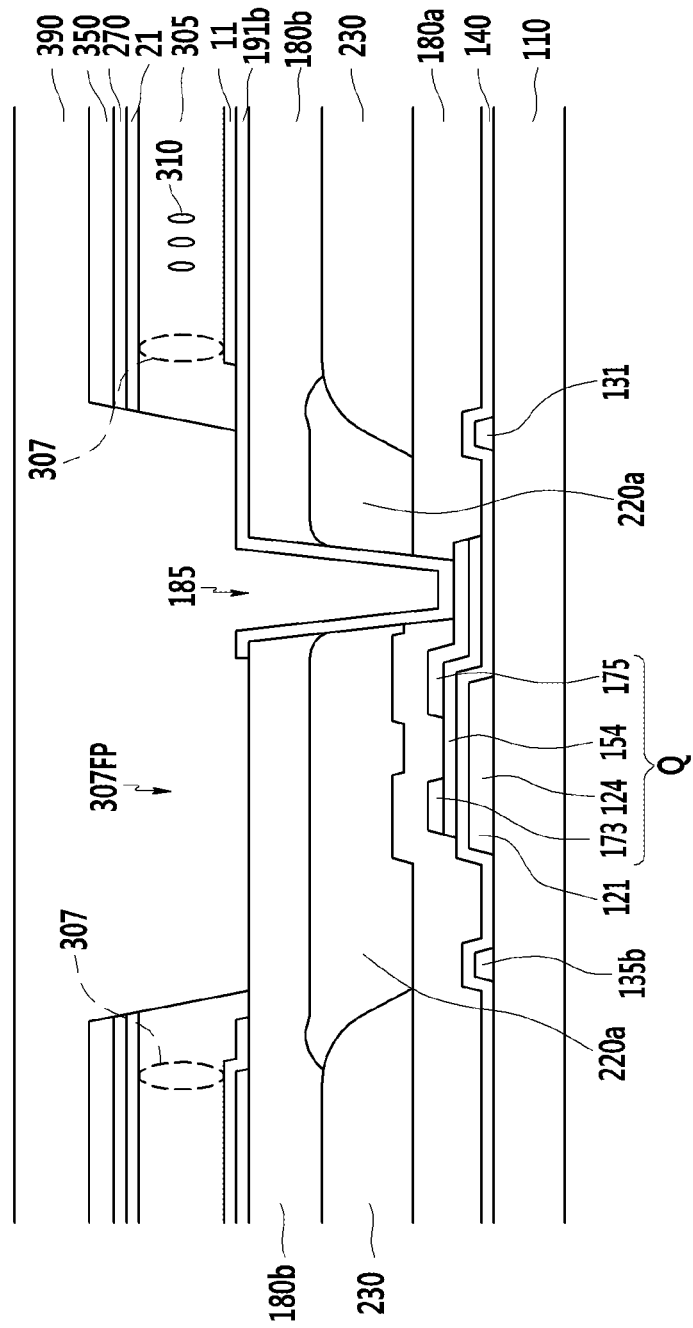
FIG. 2 is a cross-sectional view taken along a line II-II of FIG. 1.
Figure 3:
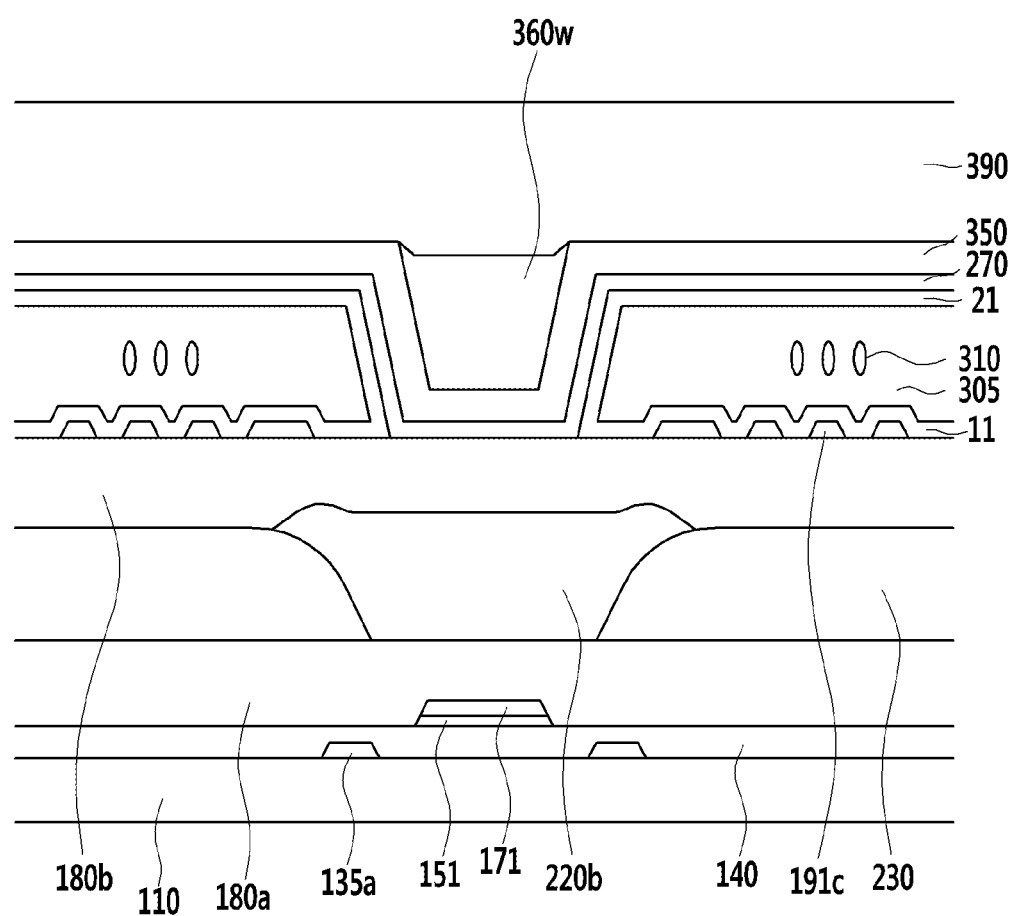
FIG. 3 is a cross-sectional view taken along a line III-III of FIG. 1.

FIG. 1 is a top plan view of a liquid crystal display according to an exemplary embodiment. FIG. 2 is a cross-sectional view taken along a line II-II of FIG. 1. FIG. 3 is a cross-sectional view taken along a line III-III of FIG. 1.

FIG. 1 shows a 2*2 pixel portion as a center portion of a plurality of pixels, and these pixels may be repeatedly arranged up/down and right/left in the liquid crystal display according to an exemplary embodiment.

Referring to FIG. 1 to FIG. 3, a gate line 121 and a storage electrode line 131 are formed on a substrate 110 made of transparent glass or plastic. The gate line 121 includes a gate electrode 124. The storage electrode line 131 is mainly extended in a horizontal direction, and transfers a predetermined voltage such as a common voltage Vcom. The storage electrode line 131 includes a pair of vertical storage electrode portions 135a substantially extended to be perpendicular to the gate line 121, and a horizontal storage electrode portion 135a connecting ends of the pair of vertical storage electrode portions 135a to each other. The storage electrode portions 135a and 135b have a structure surrounding a pixel electrode 191.

A gate insulating layer 140 is formed on the gate line 121 and the storage electrode line 131. A linear semiconductor layer 151 disposed under a data line 171 and a semiconductor layer 154 under source/drain electrodes 173, 175 and corresponding to a channel region of a thin film transistor Q are formed on the gate insulating layer 140. The linear semiconductor layer 151 and the semiconductor layer 154 under the source/drain electrodes 173, 175 and corresponding to the channel region of the thin film transistor Q may be connected to each other.

A plurality of ohmic contacts may be formed between the linear semiconductor layer 151 and the data line 171, and between the semiconductor layer 154 under the source/drain electrode and corresponding to the channel region and the source/drain electrode, and are omitted in the drawings.

Data conductors 171, 173, and 175 including the source electrode 173, the data line 171 connected to the source electrode 173, and the drain electrode 175 are formed on the semiconductor layers 151 and 154 and the gate insulating layer 140.

The gate electrode 124, the source electrode 173, and the drain electrode 175 form the thin film transistor Q along with the semiconductor layer 154, and the channel of the thin film transistor Q is formed in the exposed portion of the semiconductor layer 154 between the source electrode 173 and the drain electrode 175.

A first interlayer insulating layer 180a is formed on the data conductors 171, 173, and 175 and the exposed semiconductor layer 154. The first interlayer insulating layer 180a may include an inorganic insulator such as a silicon nitride (SiNx) and a silicon oxide (SiOx), or an organic insulator.

A color filter 230 and a light blocking member 220 are formed on the first interlayer insulating layer 180a.

The light blocking member 220 has a lattice structure having an opening corresponding to a region displaying an image, and is formed of a material that prevents light from being transmitted therethrough. The color filter 230 is formed at the opening of the light blocking member 220. The light blocking member 220 includes a horizontal light blocking member 220a formed in a direction parallel to the gate line 121, and a vertical light blocking member 220b formed in a direction parallel to the data line 171.

The color filter 230 may display one of primary colors, such as three primary colors including red, green, and blue. However, the colors are not limited to the three primary colors including red, green, and blue, and the color filter 230 may also display one among a cyan-based color, a magenta-based color, a yellow-based color, and a white-based color. The color filter 230 may be formed of materials displaying different colors for each adjacent pixel.

A second interlayer insulating layer 180b covering the color filter 230 and the light blocking member 220 is formed on the color filter 230 and the light blocking member 220. The second interlayer insulating layer 180b may include the inorganic insulating material such as a silicon nitride (SiNx) and a silicon oxide (SiOx), or the organic insulating material. Unlike the cross-sectional view of FIG. 2, in a case where a step is generated due to a difference in thickness between the color filter 230 and the light blocking member 220, the second interlayer insulating layer 180b includes an organic insulating material, so that it is possible to decrease or remove the step.

The color filter 230, the light blocking member 220, and the interlayer insulating layers 180a and 180b have a contact hole 185 extending to and exposing the drain electrode 175.

The pixel electrode 191 is formed on the second interlayer insulating layer 180b. The pixel electrode 191 may be made of a transparent conductive material such as ITO or IZO.

An overall shape of the pixel electrode 191 is a quadrangle, and the pixel electrode 191 includes cross stems configured by a horizontal stem 191a and a vertical stem 191b crossing the horizontal stem 191a. Further, the pixel electrode 191 is divided into four sub-regions by the horizontal stem 191a and the vertical stem 191b, and each sub-region includes a plurality of minute branches 191c. In the present exemplary embodiment, the pixel electrode 191 may further include an outer stem portion 191d surrounding an outer circumference of the pixel electrode 191. The outer stem portion 191d may connect the minute branches 191c from right and left outer edges. In the present exemplary embodiment, the outer stem portion 191d is disposed in the right and left outer edges of the pixel electrode 191, but it may extend to an upper or lower portion of the pixel electrode 191.

The minute branches 191c of the pixel electrode 191 form an angle of approximately 40° to 45° with the gate line 121 or the horizontal stem 191a. Further, the minute branches 191c of two adjacent sub-regions may be perpendicular to each other. Furthermore, a width of each minute branch 191c may be gradually increased, or a distance between the minute branches 191c may be varied.

The pixel electrode 191 includes an extension 197 which is connected at a lower end of the vertical stem 191b and has a larger area than the vertical stem 191b. The extension 197 of the pixel electrode 191 is physically and electrically connected to the drain electrode 175 through the contact hole 185, thereby receiving a data voltage from the drain electrode 175.

The thin film transistor Q and the pixel electrode 191 described above are just described as examples, and a structure of the thin film transistor and a design of the pixel electrode may be modified in order to improve side visibility.

A lower alignment layer 11 is formed on the pixel electrode 191, and may be a vertical alignment layer. The lower alignment layer 11, as a liquid crystal alignment layer made of a material such as polyamic acid, polysiloxane, polyimide, or the like, may include at least one of generally used materials. Also, the lower alignment layer 11 may be a photoalignment layer.

An upper alignment layer 21 is provided at a portion facing the lower alignment layer 11, and a microcavity 305 is formed between the lower alignment layer 11 and the upper alignment layer 21. A liquid crystal material including liquid crystal molecules 310 is injected into the microcavity 305 through an entrance region 307. In the present exemplary embodiment, the alignment material forming the alignment layers 11 and 21 and the liquid crystal material including the liquid crystal molecules 310 may be injected into the microcavity 305 by using capillary force.

The microcavities 305 are divided in the vertical direction by a plurality of liquid crystal injection portions 307FP disposed at a portion overlapping the gate line 121, thereby forming the plurality of microcavities 305. The plurality of microcavities 305 may be formed along a column direction of the pixel electrode 191, that is, in the vertical direction. Also, the microcavities 305 are divided in the horizontal direction by partitions 360w that will be described later, thereby forming the plurality of microcavities 305. The plurality of microcavities 305 may be formed along the row direction of the pixel electrode 191, in other words, the horizontal direction in which the gate line 121 extends. The plurality of formed microcavities 305 may respectively correspond to the pixel area, and the pixel areas may correspond to a region displaying the image.

The liquid crystal injection portion 307FP may be elongated according to the extending direction of the gate line 121. The liquid crystal injection portion 307FP may horizontally divide the microcavities 305, and may be an empty space where a common electrode 270 and an insulating layer 350 are removed. The liquid crystal injection portion 307FP may be covered by a capping layer 390 after injecting a liquid crystal material including the alignment layers 11 and 21 and the liquid crystal molecules 310 into the microcavities 305.

The liquid crystal injection portion 307FP may be a path where the alignment material or the liquid crystal material are filled in and the alignment material or the liquid crystal material are injected into the microcavity 305 through the entrance region 307.

The common electrode 270 and the insulating layer 350 are disposed on the upper alignment layer 21. The common electrode 270 receives the common voltage, and generates an electric field together with the pixel electrode 191 to which the data voltage is applied to determine a direction in which the liquid crystal molecules 310 disposed at the microcavity 305 between the two electrodes 191, 270 are inclined. The common electrode 270 may be made of the transparent conductive material such as ITO or IZO. The common electrode 270 forms a capacitor with the pixel electrode 191 to maintain the received voltage even after the thin film transistor Q is turned off. The insulating layer 350 may be the inorganic insulating layer formed of the inorganic material such as a silicon nitride (SiNx) or a silicon oxide (SiO$_x$). Although not shown, the insulating layer 350 may be formed by depositing two more inorganic layers.

In the present exemplary embodiment, the insulating layer 350 may have a function of the roof layer of the microcavity 305 so as to not change a shape thereof. The insulating layer 350 as the roof layer may have a function of supporting the structure of the microcavity 305 such that the microcavity 305 that is the space between the pixel electrode 191 and the common electrode 270 may maintain the shape thereof. To support the structure of the microcavity 305, in the present exemplary embodiment, the insulating layer 350 may be formed with a thickness of more than about 4000 angstroms, and preferably, more than 4000 angstroms to less than 10,000 angstroms.

In the present exemplary embodiment, the insulating layer 350 may be disposed on the whole area of the substrate 110 except for the portion of the insulating layer 350 that is removed in the liquid crystal injection portion 307FP.

In the present exemplary embodiment, sides of the common electrode 270 and the insulating layer 350 may be respectively exposed in the liquid crystal injection portion 307FP, and the side surfaces are disposed to be engaged with each other. In other words, the lateral wall of the common electrode 270 and the lateral wall of the insulating layer 350 are aligned.

In the present exemplary embodiment, it is described that the common electrode 270 is formed on the microcavity 305, but in another exemplary embodiment, the common electrode 270 is formed under the microcavity 305, so that liquid crystal driving according to a coplanar electrode (CE) mode is possible.

Referring to FIG. 2, the capping layer 390 is formed on the insulating layer 350. The capping layer 390 includes the organic material or the inorganic material. In detail, the capping layer 390 may be formed of a thermal hardening resin, silicon oxycarbide (SiOC), or graphene. In the present exemplary embodiment, the capping layer 390 may contact the upper surface of the insulating layer 350. The capping layer 390 may be disposed at the liquid crystal injection portion 307FP as well as at the insulating layer 350. At this time, the entrance region 307 of the microcavity 305 exposed by the liquid crystal injection portion 307FP may be covered by the capping layer 390. In the present exemplary embodiment, the liquid crystal material is removed in the liquid crystal injection portion 307FP. But, in a modified exemplary embodiment, the liquid crystal material may remain at the liquid crystal injection portion 307FP after being injected to the microcavity 305.

In the present exemplary embodiment, the partition 360w is formed between the microcavities 305 adjacent in the horizontal direction, as shown in FIG. 3. The partition 360w may extend according to the direction parallel to the data line 171 and may be covered by the capping layer 390. In the present exemplary embodiment, the upper surface of the partition 360w may contact the capping layer 390. The partition 360w may include a photoresist or other organic materials. The partition 360w can partition or define the microcavities 305 according to the horizontal direction. In the present exemplary embodiment, the partition 360w is formed between the microcavities 305 such that generated stress is reduced even if the substrate 110 is bent, and a change degree of a cell gap may be remarkably reduced.

Figure 4:
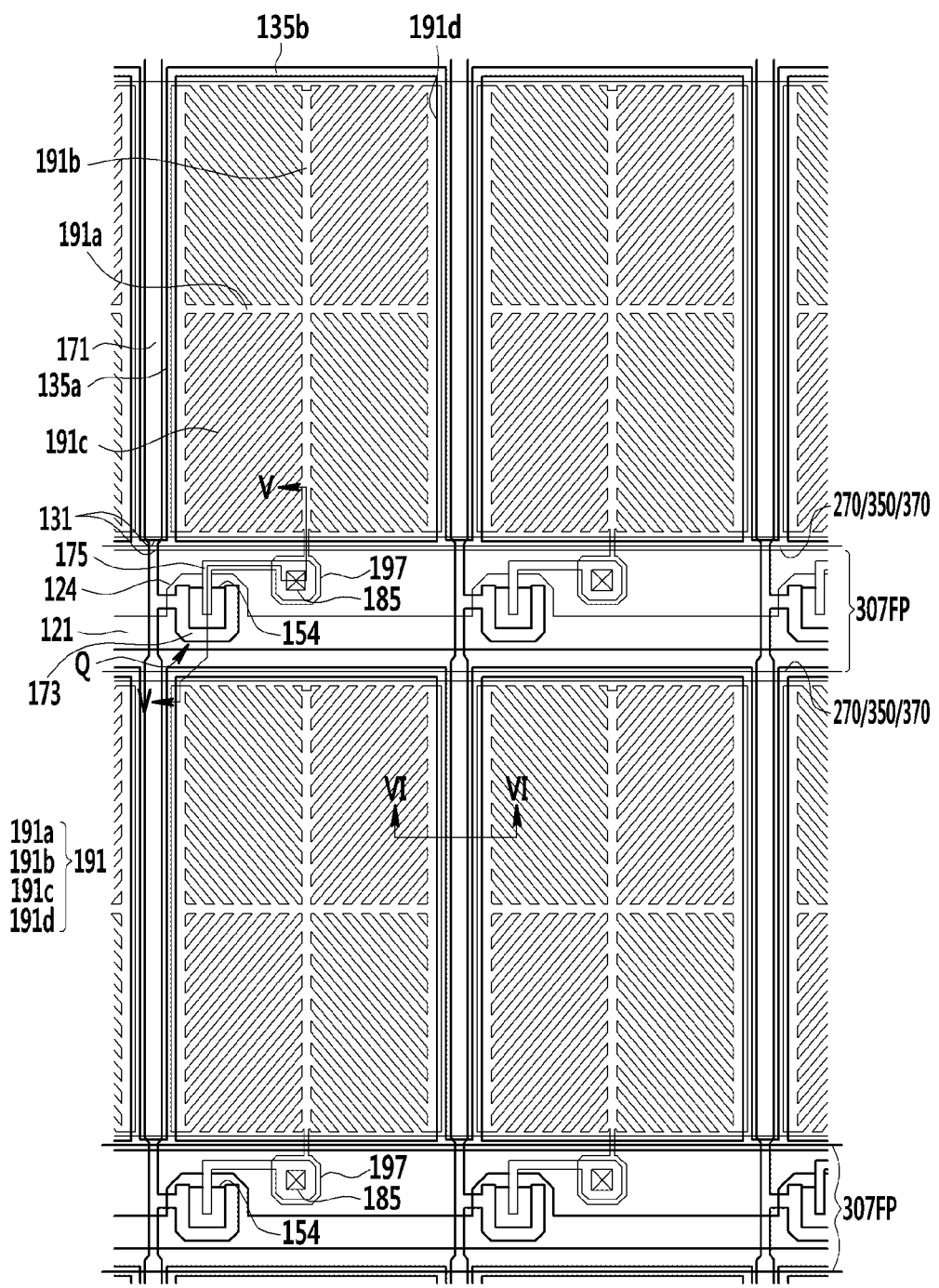
FIG. 4 is a top plan view of a liquid crystal display according to an exemplary embodiment.
Figure 5:
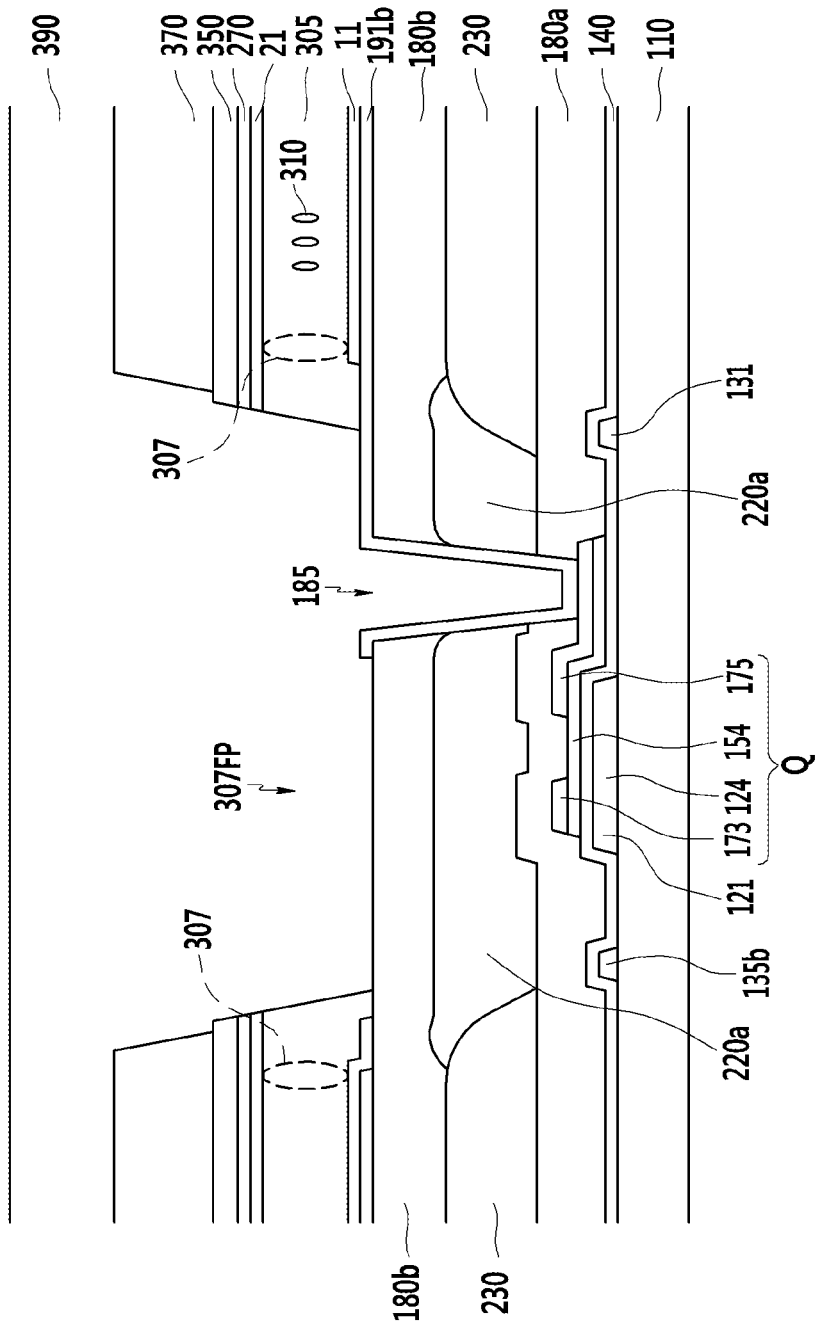
FIG. 5 is a cross-sectional view taken along a line V-V of FIG. 4.
Figure 6:
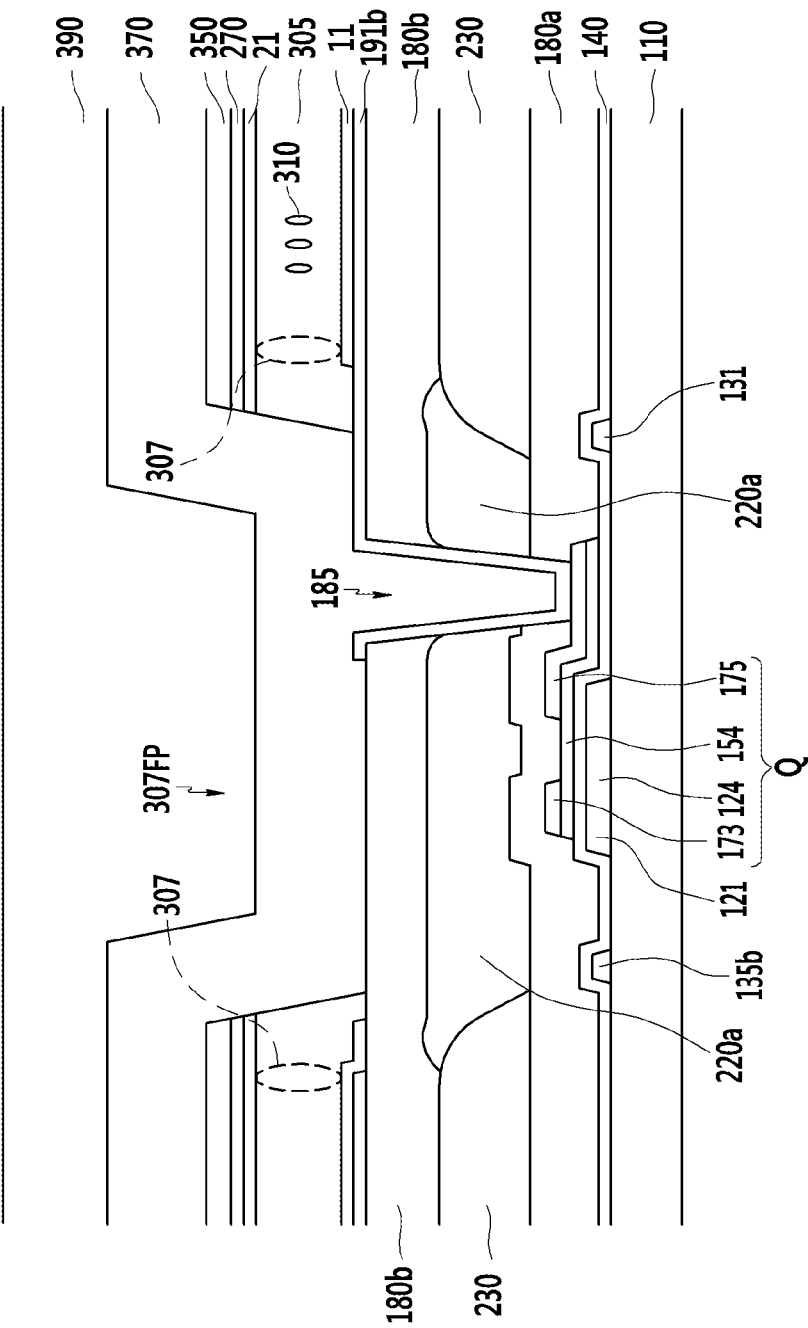
FIG. 6 is a cross-sectional view taken along a line V-V of FIG. 4 in accordance with another embodiment.
Figure 7:
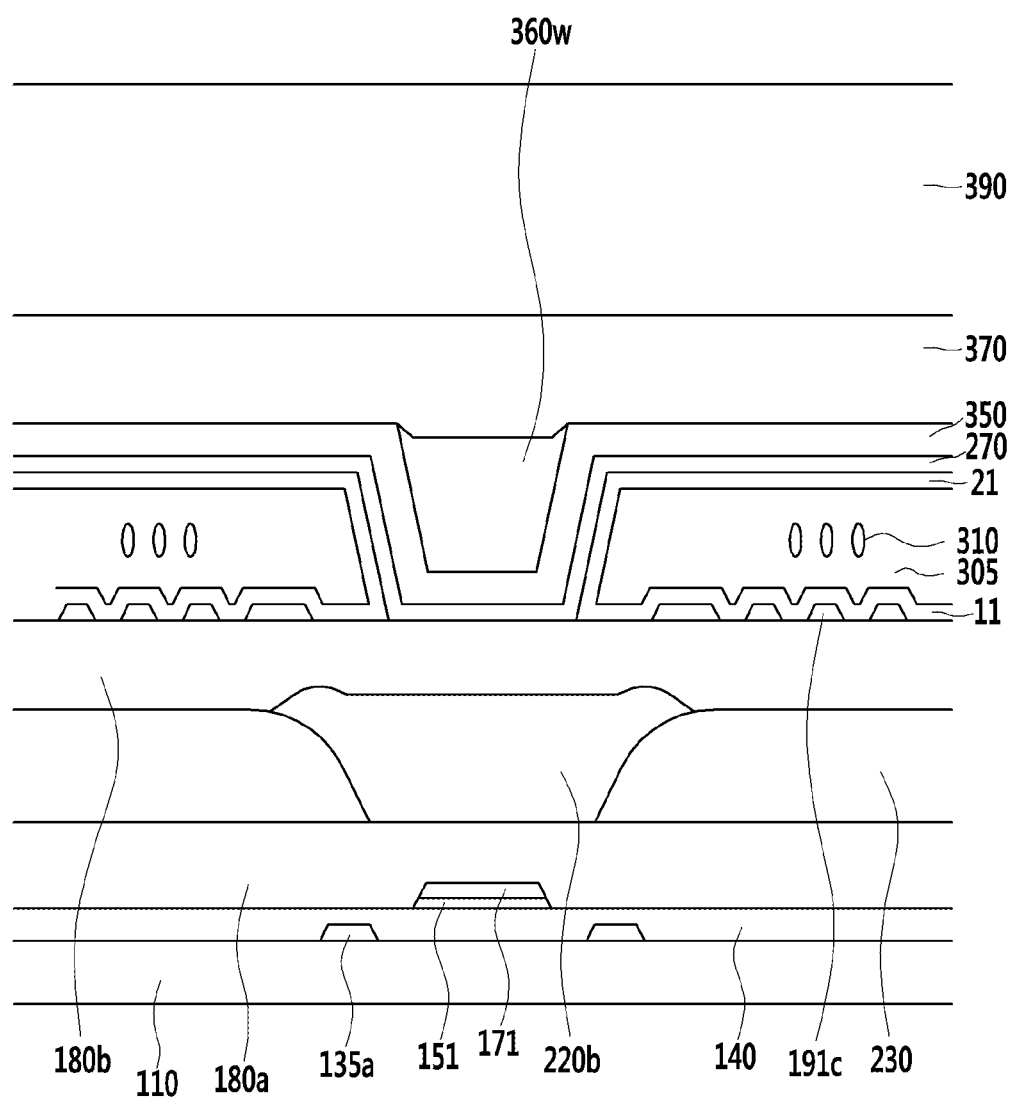
FIG. 7 is a cross-sectional view taken along a line VI-VI of FIG. 4.

FIG. 4 is a top plan view of a liquid crystal display according to an exemplary embodiment. FIG. 5 is a cross-sectional view taken along a line V-V of FIG. 4. FIG. 6 is a cross-sectional view taken along a line V-V of FIG. 4 in accordance with another embodiment. FIG. 7 is a cross-sectional view taken along a line VI-VI of FIG. 4.

The roof layer structure of embodiment shown in FIG. 1, FIG. 2, and FIG. 3 may be modified in embodiment shown in FIG. 4, FIG. 5, and FIG. 7.

Referring to FIG. 4, FIG. 5, FIG. 7, an insulating layer 350 is disposed on the common electrode 270, and a roof layer 370 is disposed on the partition 360w. The insulating layer 350 may be formed with a thinner thickness than the roof layer 370, and a thickness of more than about 4,000 angstroms, and preferably, more than 4,000 angstroms to less than 10,000 angstroms. The roof layer 370 may contact the insulating layer 350 in a portion corresponding to the microcavity 305. Referring to FIG. 5, the roof layer 370 is patterned to have a removed shape in the liquid crystal injection portion 307FP. Here, the liquid crystal injection portion 307FP may be covered by the capping layer 390.

Beside the differences described above, all contents of embodiment in FIG. 1, FIG. 2, and FIG. 3 may be applied in embodiment of FIG. 4, FIG. 5, and FIG. 7.

FIG. 6 shows a modified embodiment of FIG. 5. Referring to FIG. 6, the roof layer 370 may cover the liquid crystal injection portion 307FP. The capping layer 390 is disposed on the roof layer 370.

Beside the differences described above, all contents of embodiment in FIG. 4, FIG. 5, and FIG. 7 may be applied in embodiment of FIG. 6.

Figure 8:
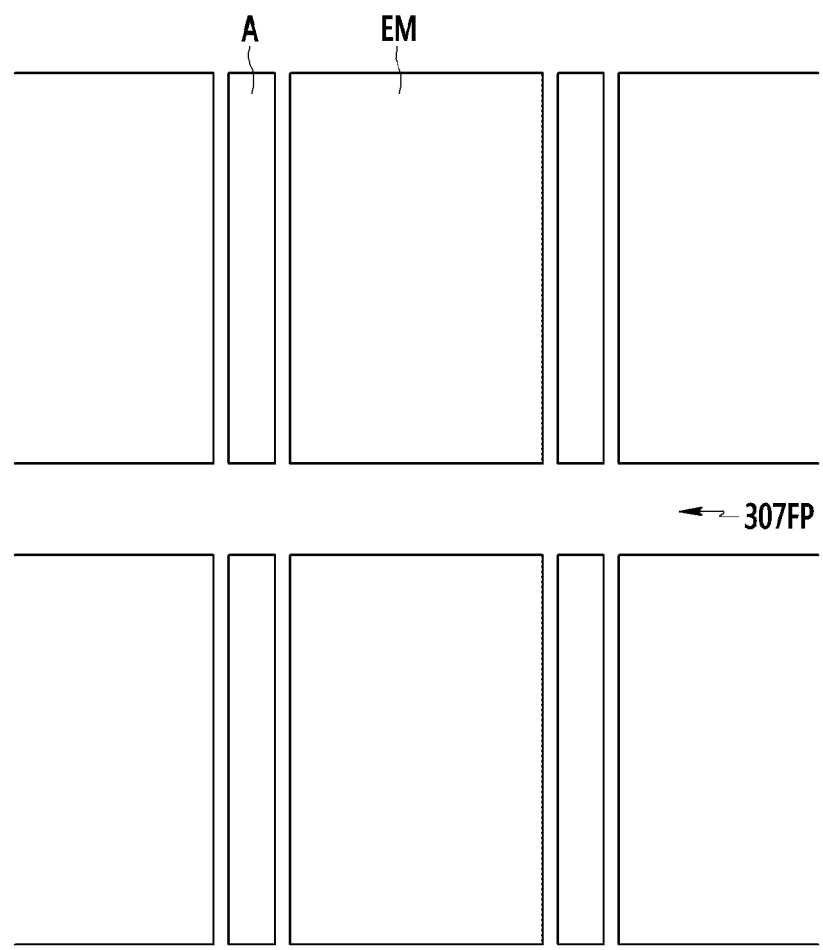
FIG. 8 is a schematic top plan view of a region where a partition is formed in the exemplary embodiment of FIG. 1 to FIG. 3.

Next, a region where the partition 360w is formed will be described with reference to FIG. 8. FIG. 8 is a schematic top plan view of a region where a partition is formed in the exemplary embodiment of FIG. 1 to FIG. 3. FIG. 8 schematically shows a portion corresponding to the top plan view of FIG. 1.

Referring to FIG. 8, a first region EM corresponding to the plane region of the microcavity 305 corresponding to the pixel electrode 191 and a second region A where the partition 360w is formed between the first regions EM are disposed. The partitions 360w are arranged side by side to one another. Referring to FIG. 1 and FIG. 8, the second region A has a bar shape while overlapping the data line 171 and is disconnected at the liquid crystal injection portion 307FP. In other words, the partition 360w may be disconnectedly formed according to the direction of the data line 171. The liquid crystal injection portion 307FP is a space that is elongated according to the extending direction of the gate line 121 while overlapping the gate line 121 such that the partition 360w may not exist at a portion where the gate line 121 and the data line 171 are crossed. The partition 360w may not cross the gate line 121. Alternatively, the partition 360w may be connectedly formed according to the direction of the data line 171.

Next, an exemplary embodiment of a method manufacturing the described liquid crystal display will be described with reference to FIG. 9 to FIG. 21. An exemplary embodiment to be described below is an exemplary embodiment of the manufacturing method and may be modified in another form.

FIG. 9 to FIG. 21 are cross-sectional views showing a manufacturing method of a liquid crystal display according to an exemplary embodiment. FIG. 9, FIG. 11, FIG. 13, FIG. 14, FIG. 16, FIG. 18, and FIG. 20 sequentially show the cross-sectional views taken along the line II-II of FIG. 1. FIG. 10, FIG. 12, FIG. 15, FIG. 17, FIG. 19, and FIG. 21 show the cross-sectional views taken along the line III-III of FIG. 1.

Figure 9:
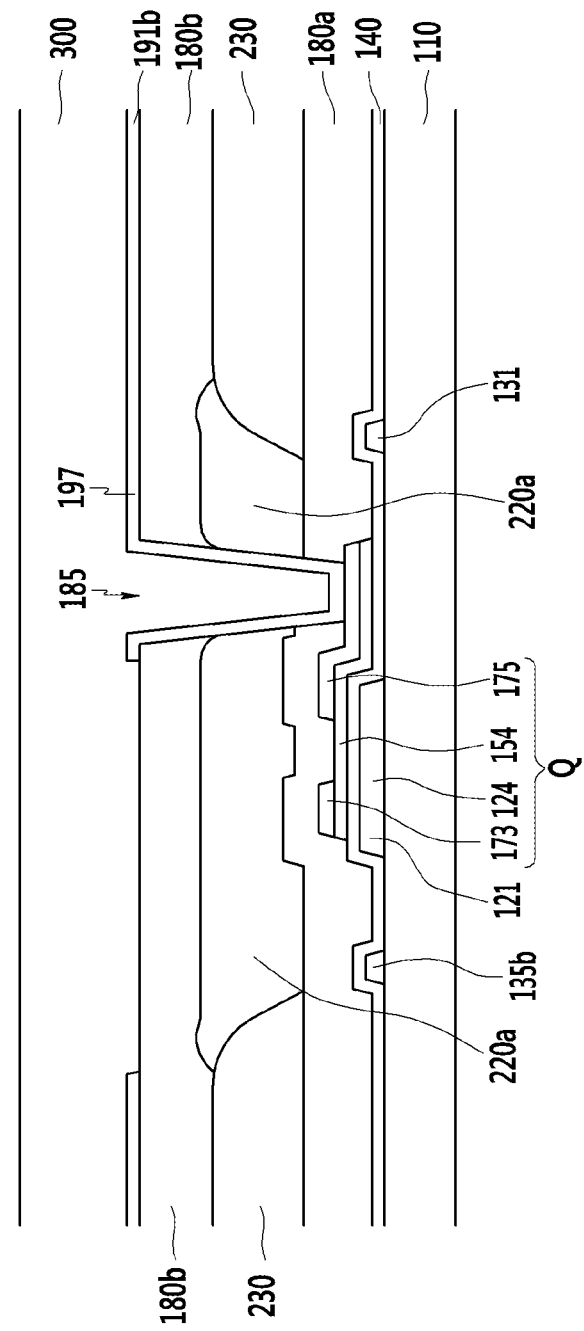
FIGS. 9, 10, 11, 12, 13, 14, 15, 16, 17, 18, 19, 20, 21 are cross-sectional views showing a manufacturing method of a liquid crystal display according to an exemplary embodiment.
Figure 10:
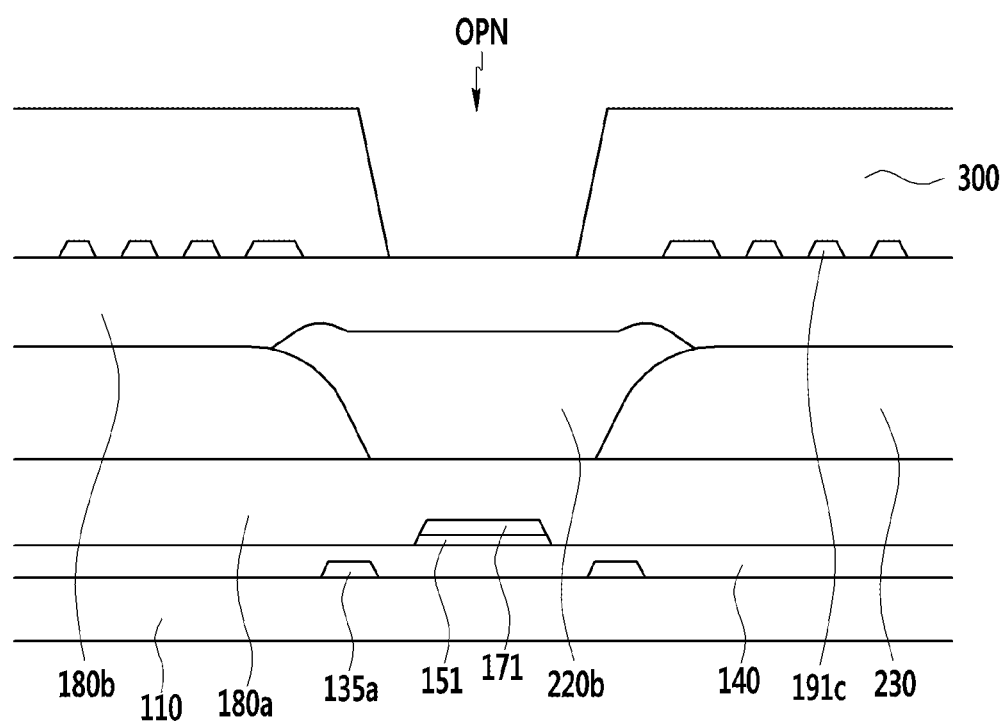

Referring to FIG. 1, FIG. 9, and FIG. 10, to form a generally known switching element on a substrate 110, a gate line 121 extending in a horizontal direction and a gate insulating layer 140 on the gate line 121 are formed, semiconductor layers 151 and 154 are formed on the gate insulating layer 140, and a source electrode 173 and a drain electrode 175 are formed. At this time, the data line 171 connected to the source electrode 173 may be formed to extend in a vertical direction while crossing the gate line 121.

The first interlayer insulating layer 180a is formed on the data conductors 171, 173, and 175 including the source electrode 173, the drain electrode 175, and the data line 171, and the exposed portion of the semiconductor layer 154.

The color filter 230 is formed at a position corresponding to the pixel area on the first interlayer insulating layer 180a, and the light blocking members 220 are formed between the color filters 230. The light blocking member 220 includes a horizontal light blocking member 220a formed in a direction parallel to the gate line 121, and a vertical light blocking member 220b formed in a direction parallel to the data line 171.

The second interlayer insulating layer 180b covering the color filter 230 and the light blocking member 220 is formed on the color filter 230 and the light blocking member 220. The second interlayer insulating layer 180b is formed to have the contact hole 185 for electrically and physically connecting the pixel electrode 191 and the drain electrode 175.

Next, the pixel electrode 191 is formed on the second interlayer insulating layer 180b, and a sacrificial layer 300 is formed on the pixel electrode 191. As shown in FIG. 10, an opening OPN is formed in the sacrificial layer 300 on the data line 171. The opening OPN may be formed with a shape elongated along the direction of the data line 171.

In a subsequent process, the common electrode 270, the insulating layer 350, and an organic layer 360 are filled in the open portion OPN, and the organic layer 360 is patterned to form the partition 360w as described below. The common electrode 270 may be made of a transparent conductive material such as ITO or IZO. The insulating layer 350 may be an inorganic insulating layer formed of an inorganic material such as a silicon nitride (SiNx) or a silicon oxide (SiO$_x$).

Figure 11:
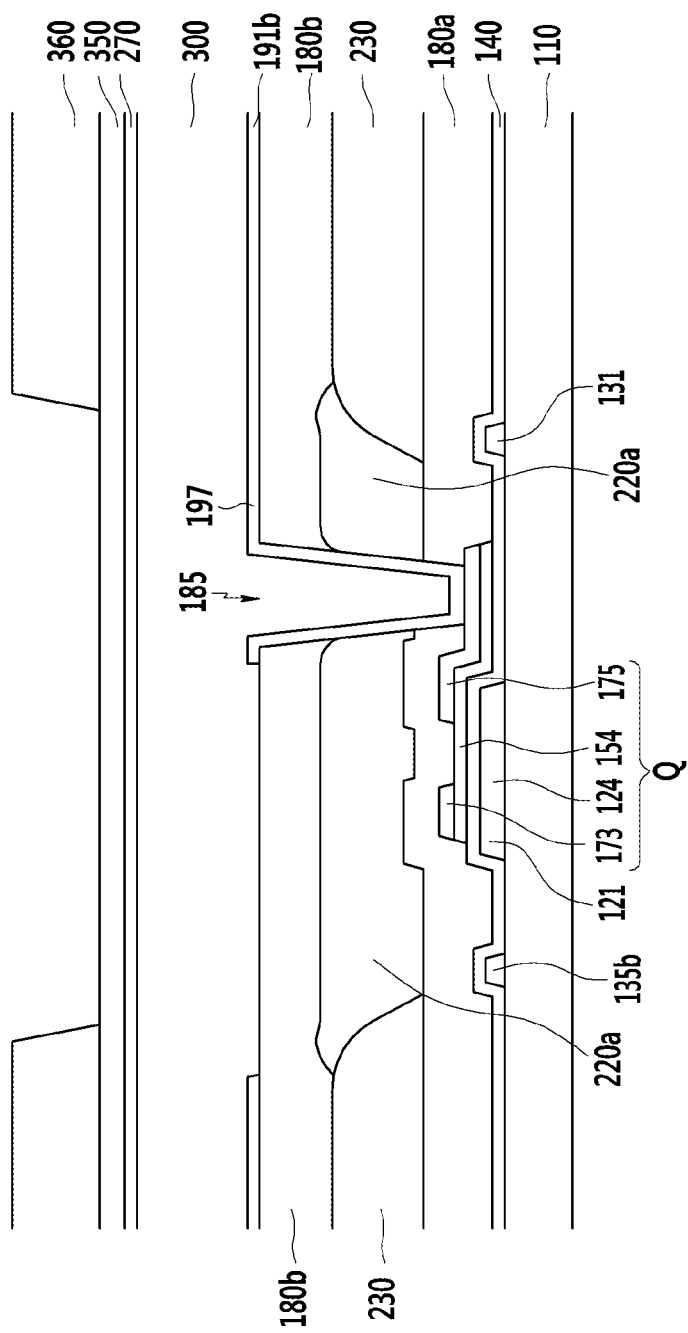
Figure 12:
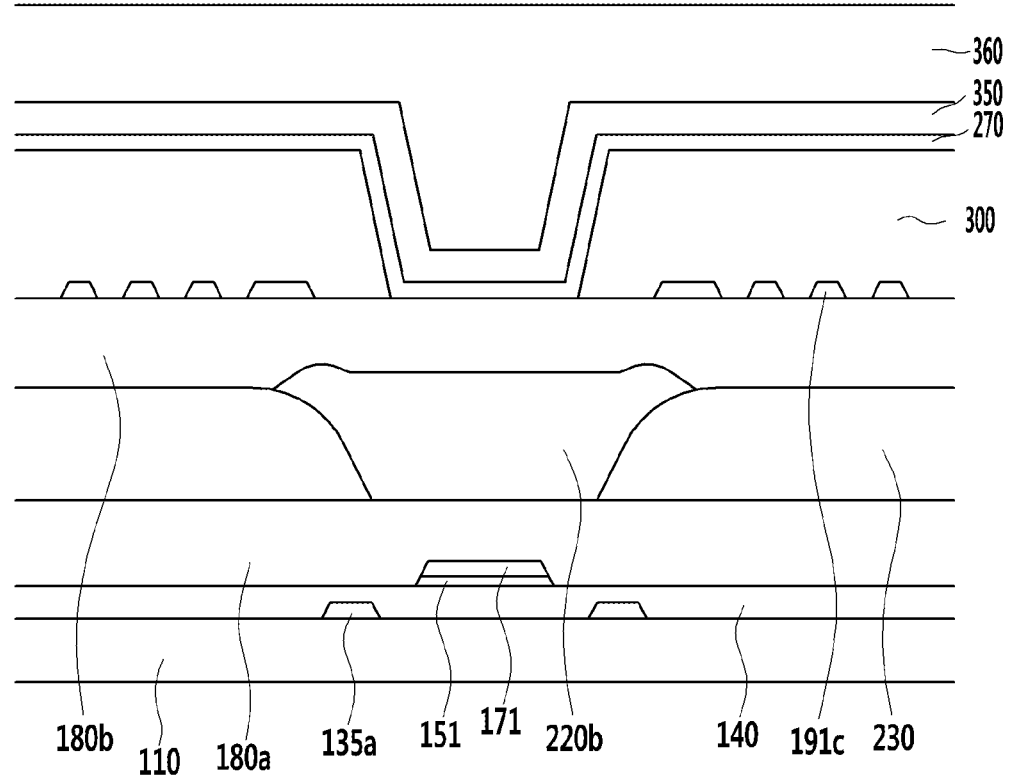

Referring to FIG. 1, FIG. 11, and FIG. 12, the common electrode 270, the insulating layer 350, and the organic layer 360 are sequentially formed on the sacrificial layer 300. The insulating layer 350 may be an inorganic insulating layer formed of an inorganic material such as a silicon nitride (SiNx) or a silicon oxide (SiO$_x$). The organic layer 360 may be a photoresist. In the present exemplary embodiment, the organic layer 360 may be formed with a thickness of less than 2 μm.

The organic layer 360 may be removed in a region corresponding to the horizontal light blocking member 220a disposed between the adjacent pixel areas in the vertical direction through exposing and developing processes. The organic layer 360 exposes the insulating layer 350 to the outside in the region corresponding to the horizontal light blocking member 220a. At this time, the common electrode 270, the insulating layer 350, and the organic layer 360 may fill the opening OPN above the transverse light blocking member 220b.

Figure 13:
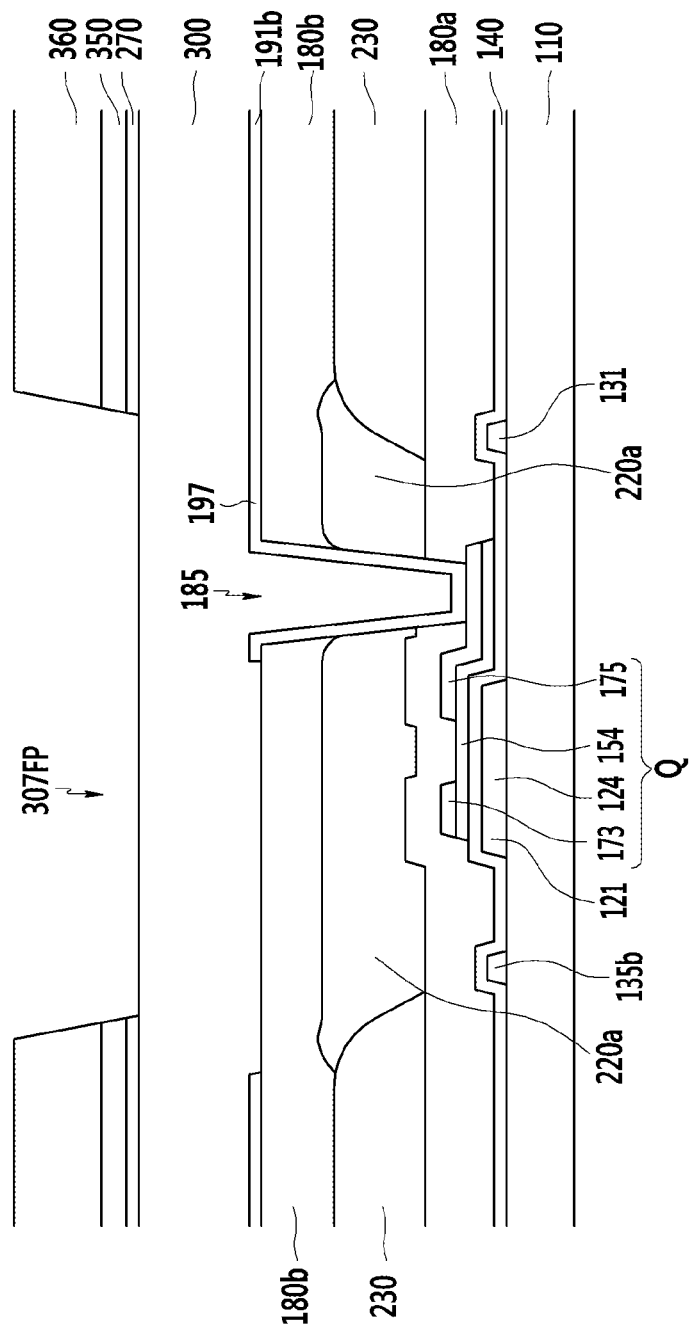

Referring to FIG. 13, the insulating layer 350 and the common electrode 270 may be patterned by using the organic layer 360 as a mask. The insulating layer 350 and the common electrode 270 may be etched by a dry etching method. By partially removing the insulating layer 350 and the common electrode 270, a liquid crystal injection portion 307FP is formed.

Figure 14:
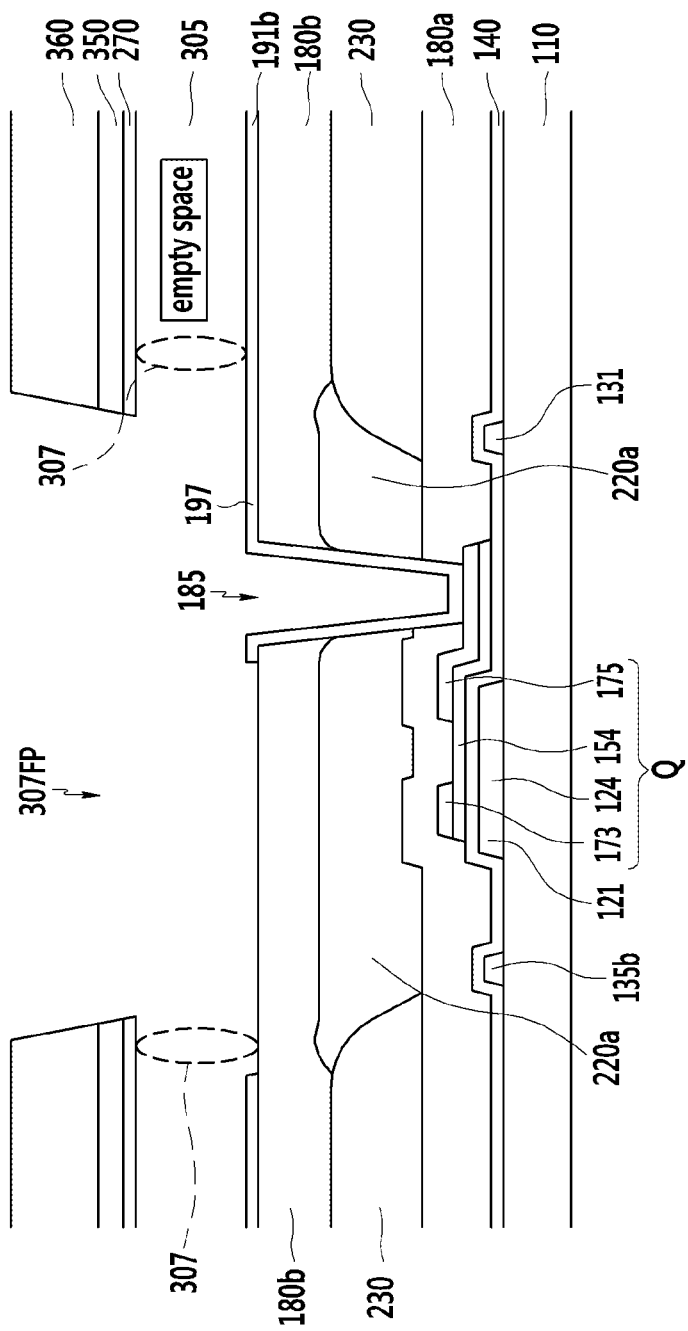
Figure 15:
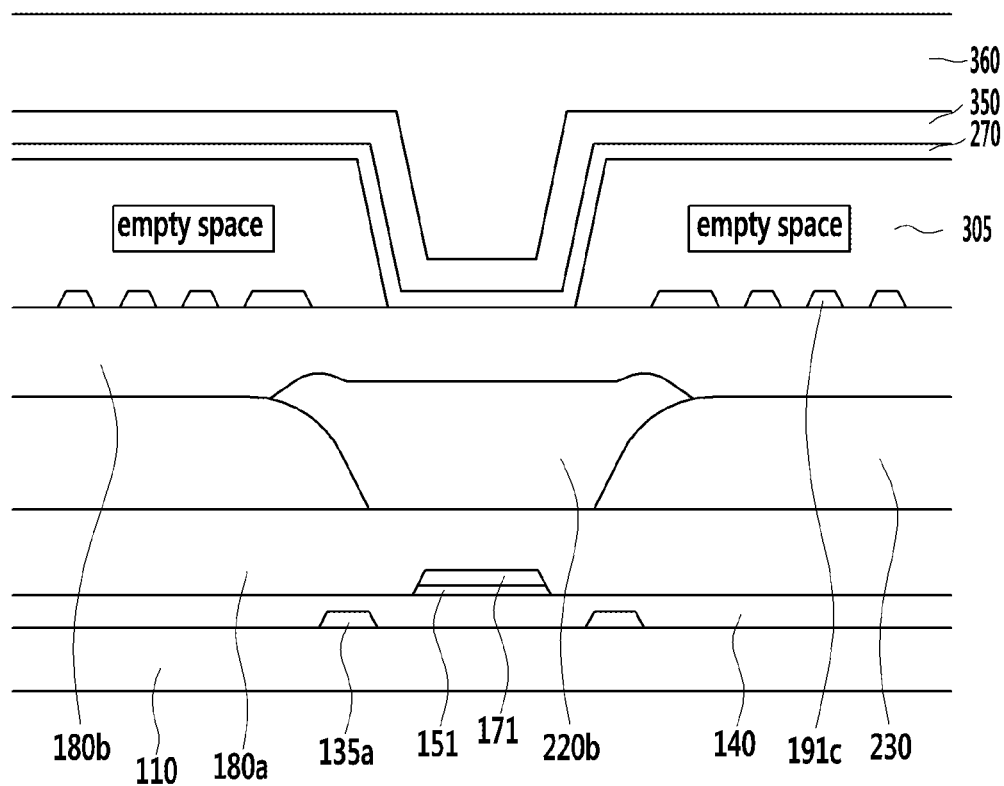

Referring to FIG. 1, FIG. 14, and FIG. 15, the sacrificial layer 300 is removed through the liquid crystal injection portion 307FP by oxygen (O$_2$) ashing treatment or a wet etching method. At this time, the microcavity 305 having the entrance region 307 is formed. The microcavity 305 is an empty space formed when the sacrificial layer 300 is removed.

Figure 16:
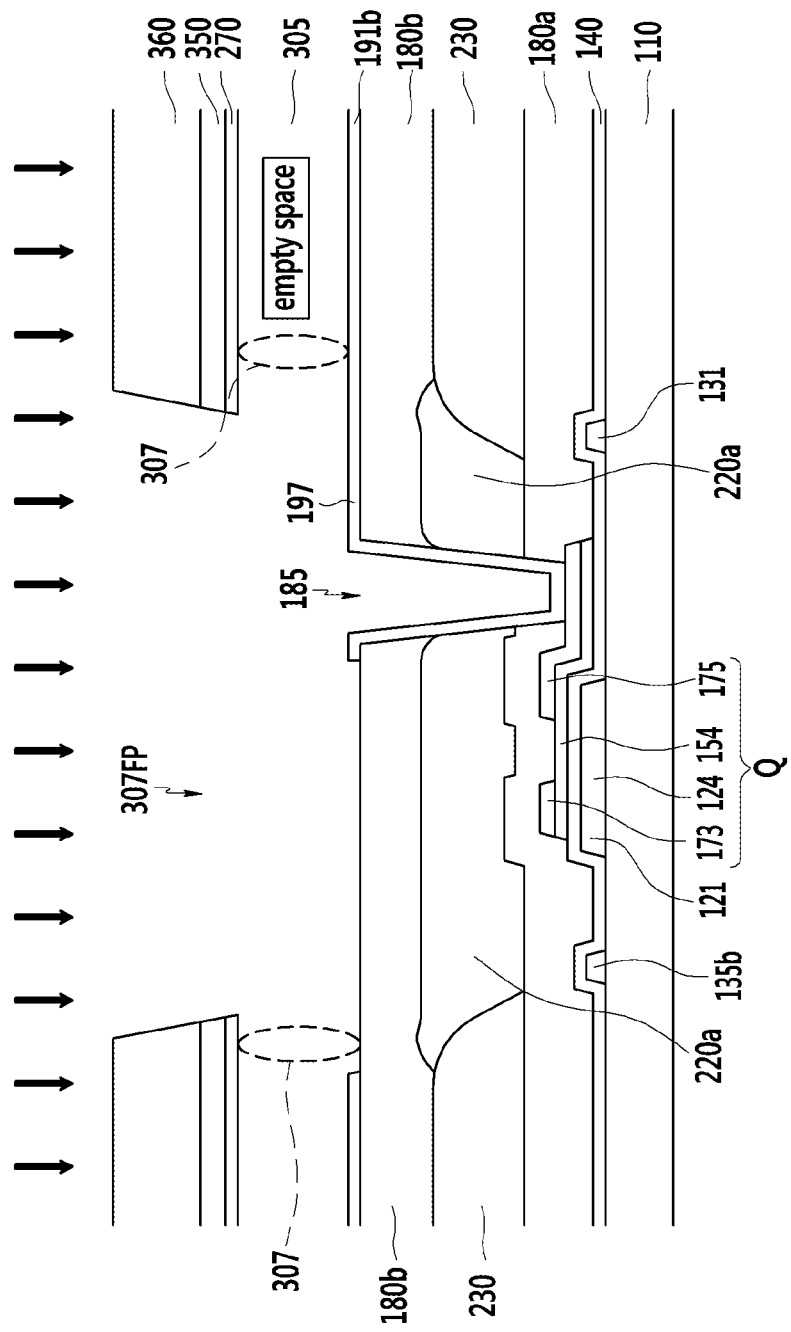
Figure 17:
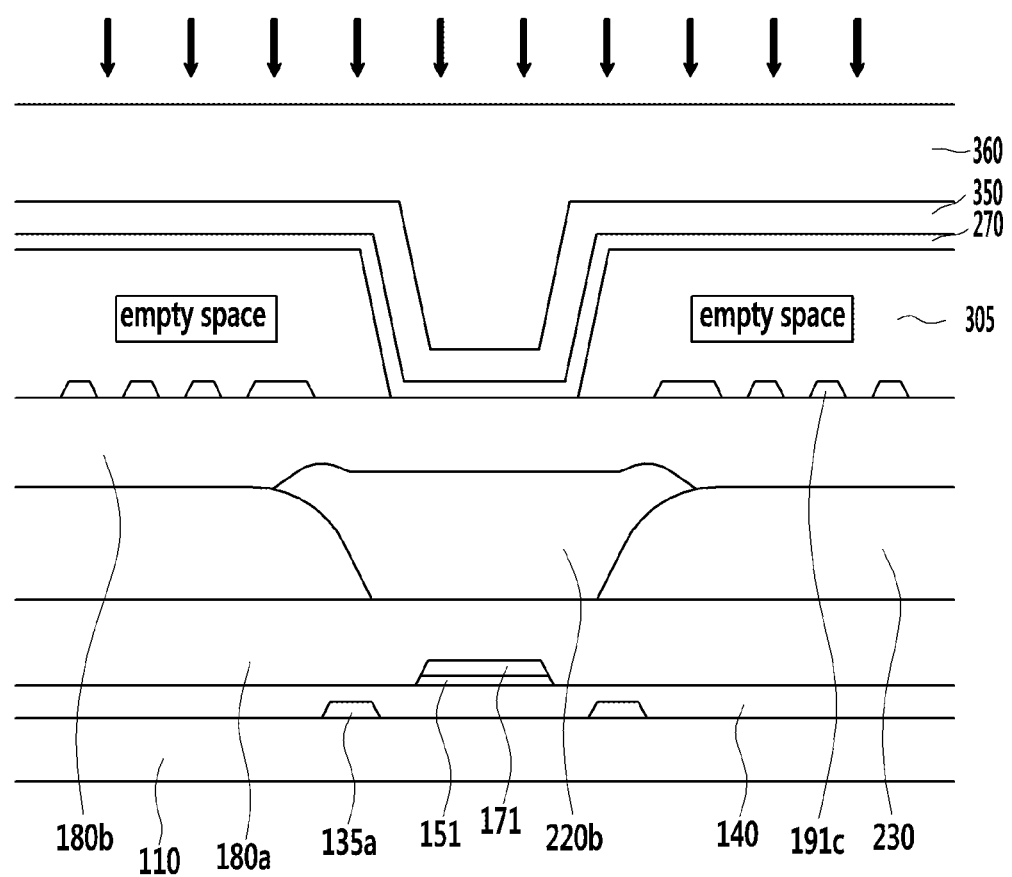

Referring to FIG. 1, FIG. 16, and FIG. 17, after the sacrificial layer 300 is removed, an ashing treatment may be performed. At this time, an oxygen (O$_2$) ashing treatment may be performed. This may be a process to prevent the liquid crystal display from not being operated by interference with the liquid crystal alignment when the sacrificial layer 300 is not previously completely removed and partially remains. In the present exemplary embodiment, the organic layer 360 may be selectively removed in the ashing treatment. To selectively remove the organic layer 360 on the microcavity 305, the organic layer 360 may be coated with the thickness of less than 2 μm in the process of forming the organic layer 360. However, to control the thickness of the removed organic layer 360, a time of the ashing treatment may be controlled regardless of the coating thickness.

Figure 18:
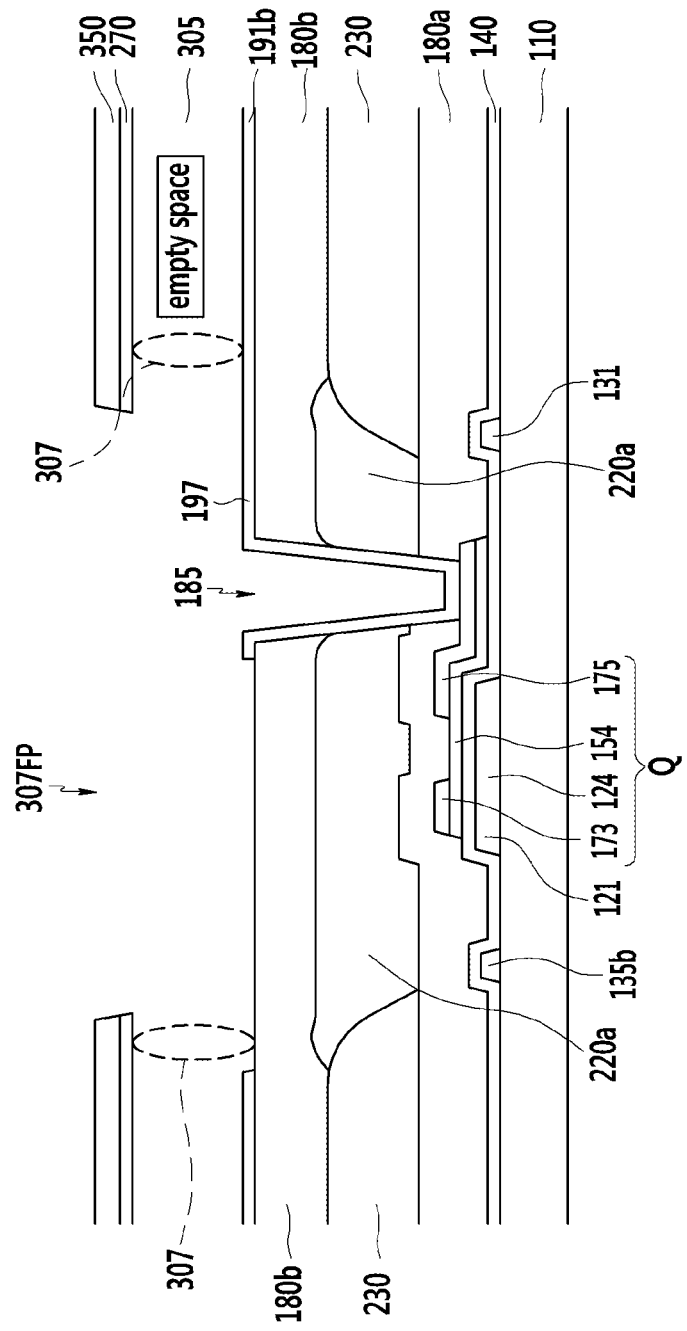
Figure 19:
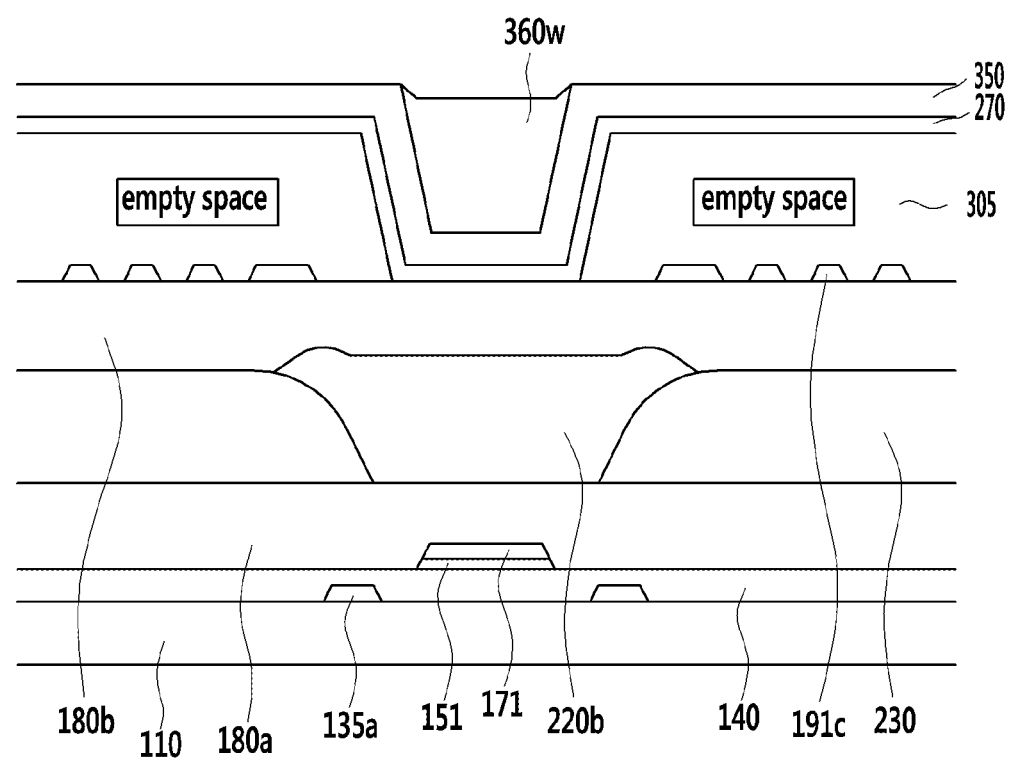

Referring to FIG. 1, FIG. 18, and FIG. 19, the organic layer 360 on the microcavity 305 may be selectively removed by the ashing treatment as described above in reference to FIGS. 16, 17. In the present exemplary embodiment, as shown in FIG. 19, the partition 360w is formed between the microcavities 305 adjacent in the direction that the gate lines 121 are extended. In the present exemplary embodiment, the organic layer 360 is selectively removed, and only the organic layer 360 remains at the opening OPN formed in FIG. 10 to form the partition 360w.

As described above, according to the present exemplary embodiment, since the organic layer 360 covers the insulating layer 350 including the inorganic material in the process, the insulating layer 350 may be prevented from being damaged. Also, the organic layer 360 is finally removed at the portion of the insulating layer 350 corresponding to the microcavity 305 such that a structural deformation by a stress difference may be prevented between the inorganic layer, e.g., the insulating layer 350, and the organic layer. e.g., the organic layer 360.

Figure 20:
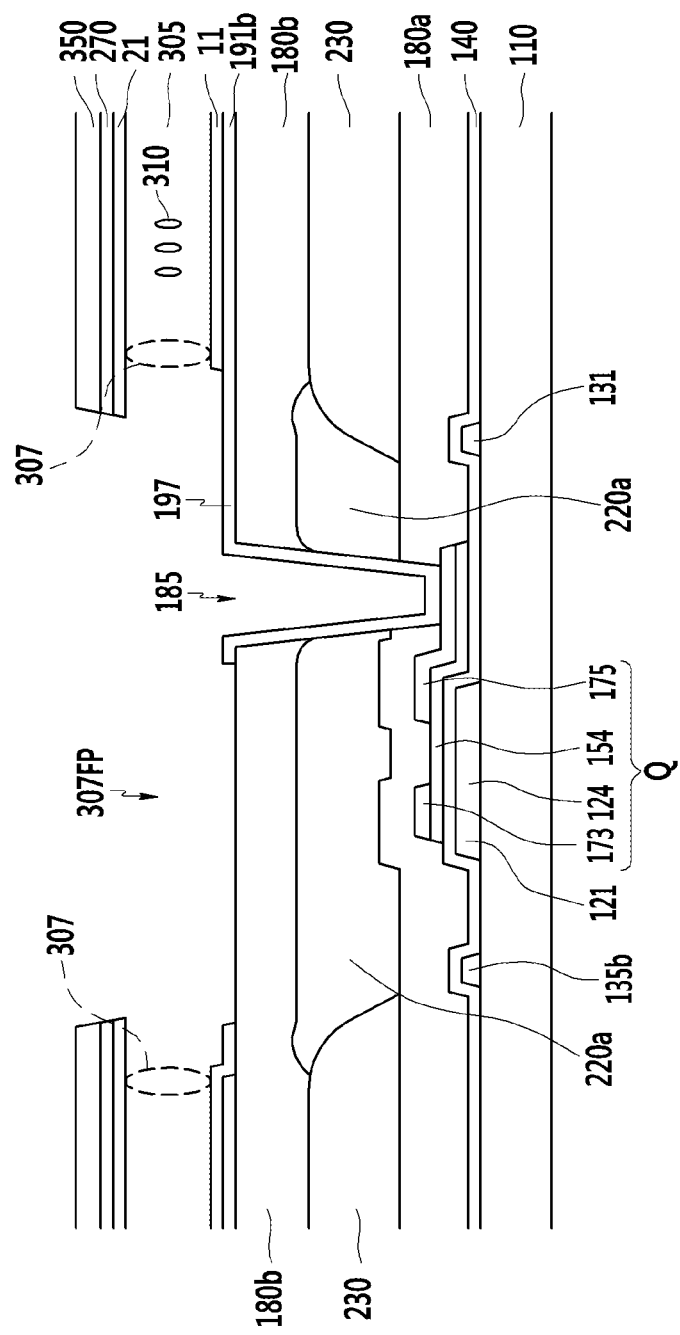
Figure 21:
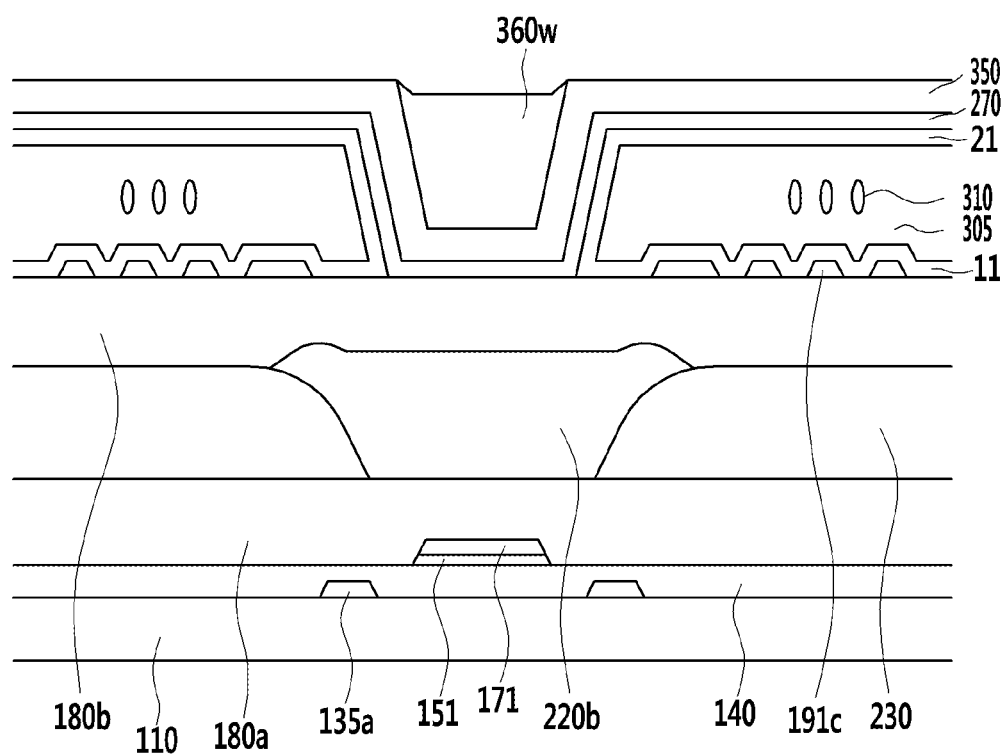

Referring to FIG. 1, FIG. 20, and FIG. 21, an alignment material is injected through the liquid crystal injection portion 307FP and the entrance region 307 to form alignment layers 11 and 21 on the pixel electrode 191 and the common electrode 270. In detail, a bake process is performed after injecting an alignment material including a solid content and a solvent through the entrance region 307.

Next, a liquid crystal material including the liquid crystal molecules 310 is injected into the microcavity 305 via the entrance region 307, using an inkjet method and the like.

Thereafter, the capping layer 390 is formed on the insulating layer 350 to cover the entrance region 307 and the liquid crystal injection portion 307FP to form the liquid crystal display illustrated in FIGS. 2 and 3.

Next, an exemplary embodiment of a method manufacturing the described liquid crystal display will be described with reference to FIG. 22 to FIG. 24. An exemplary embodiment to be described below is an exemplary embodiment of the manufacturing method and may be modified in another form.

Figure 22:
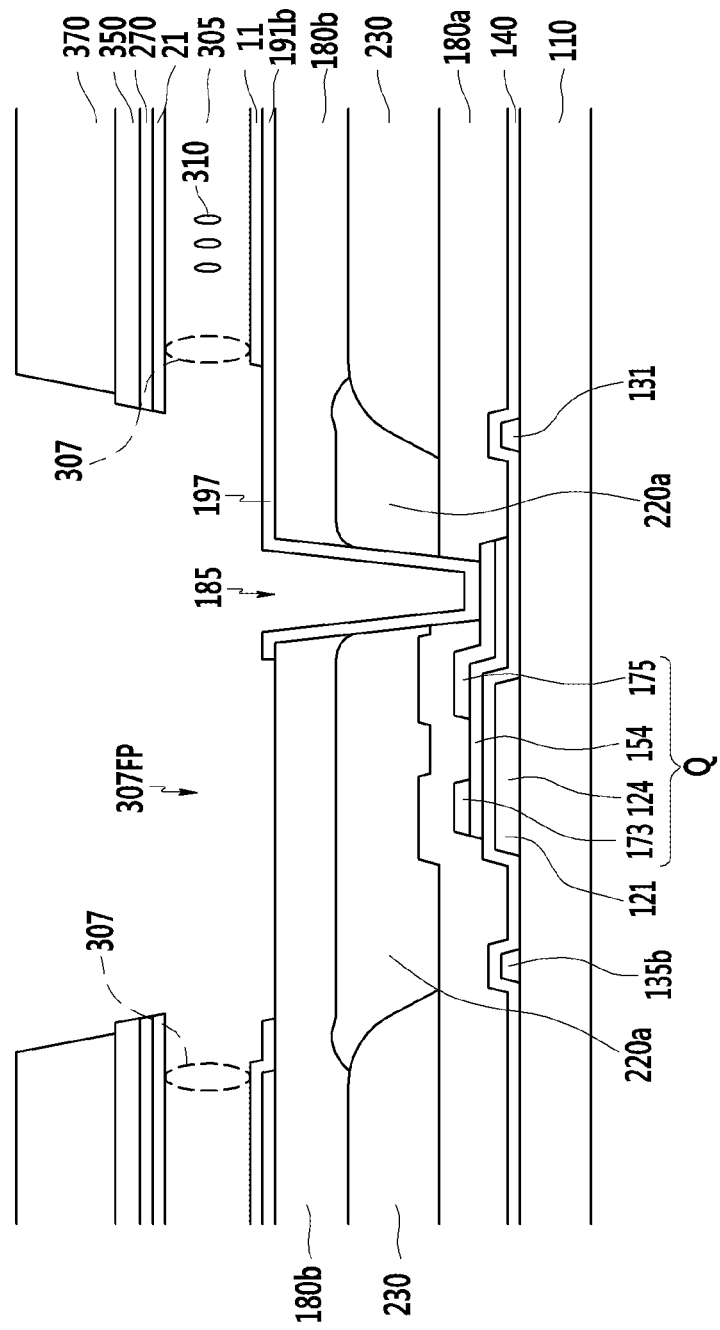
FIGS. 22, 23, 24 are cross-sectional views showing a manufacturing method of a liquid crystal display according to an exemplary embodiment.
Figure 23:
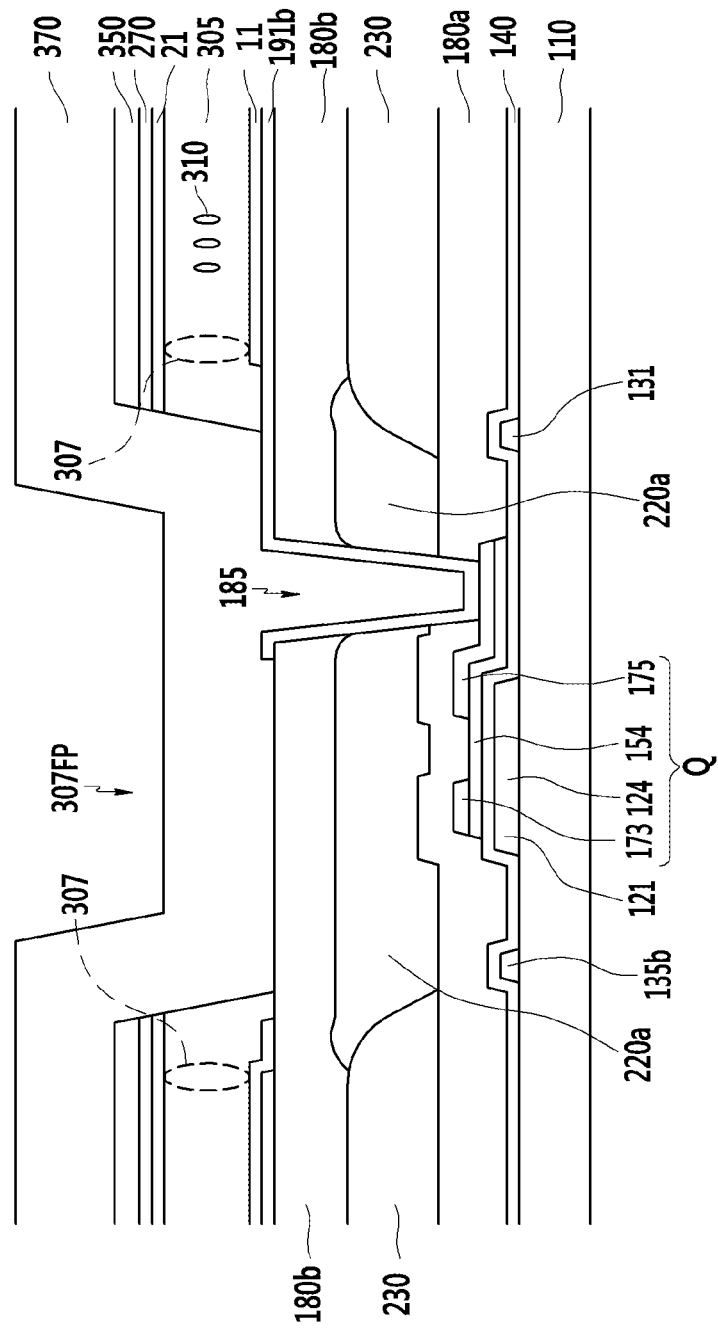
Figure 24:
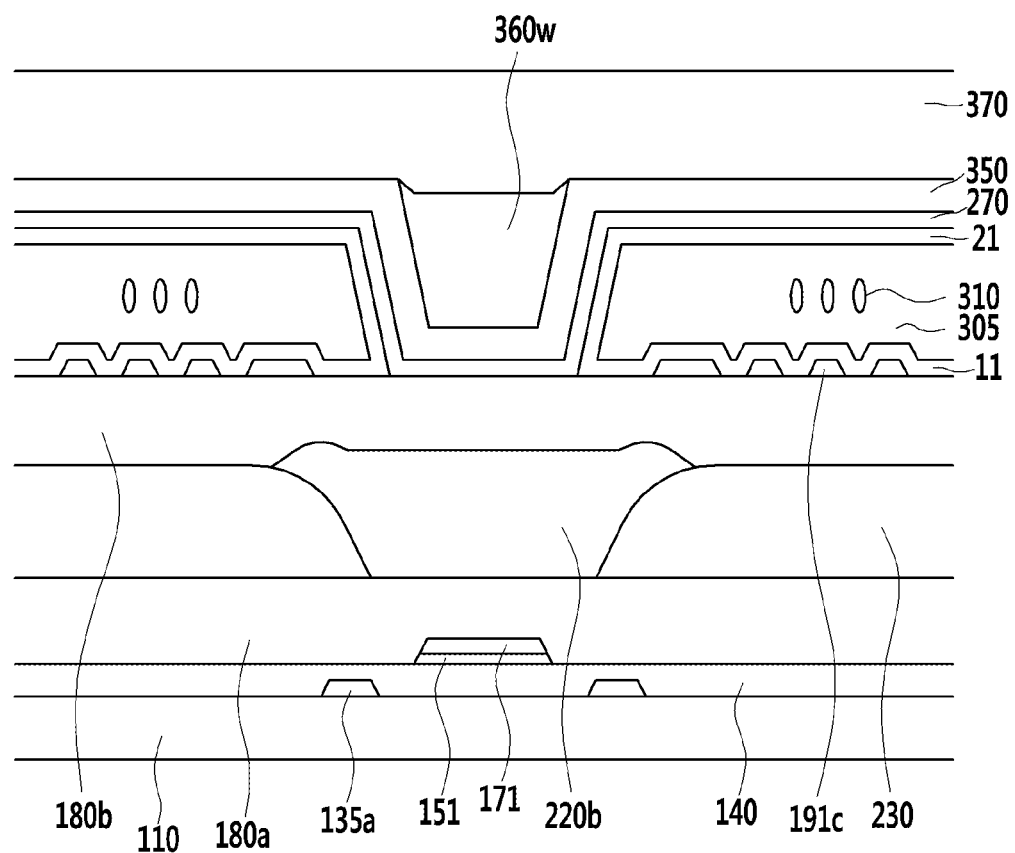

FIGS. 22, 23, and 24 are cross-sectional views showing a manufacturing method of a liquid crystal display according to an embodiment of FIG. 4 to FIG. 7.

The same or similar process as described in FIG. 9 to FIG. 19 is performed to form the roof layer 370 after selectively removing the organic layer 360 or the same or similar process as described in FIG. 9 to FIG. 21 is performed to form the roof layer 370 after injecting liquid crystal materials.

Referring to FIG. 22, FIG. 24, the roof layer 370 is formed on the insulating layer 350, and the roof layer 370 may be removed in the liquid crystal injection portion 307FP by patterning the roof layer 370. However, in the case of forming the roof layer 370 after injecting the liquid crystal materials, the roof layer 370 may remain in the liquid crystal injection portion 307FP as shown in FIG. 23.

Thereafter, the capping layer 390 on the roof layer 370 is formed to cover the entrance region 307 and the liquid crystal injection portion 307FP to form the liquid crystal display illustrated in FIGS. 5 and 7. In another embodiment, the capping layer 390 on the roof layer 370 is formed to cover the liquid crystal injection portion 307FP to form the liquid crystal display illustrated in FIGS. 6 and 7.

Figure 25:
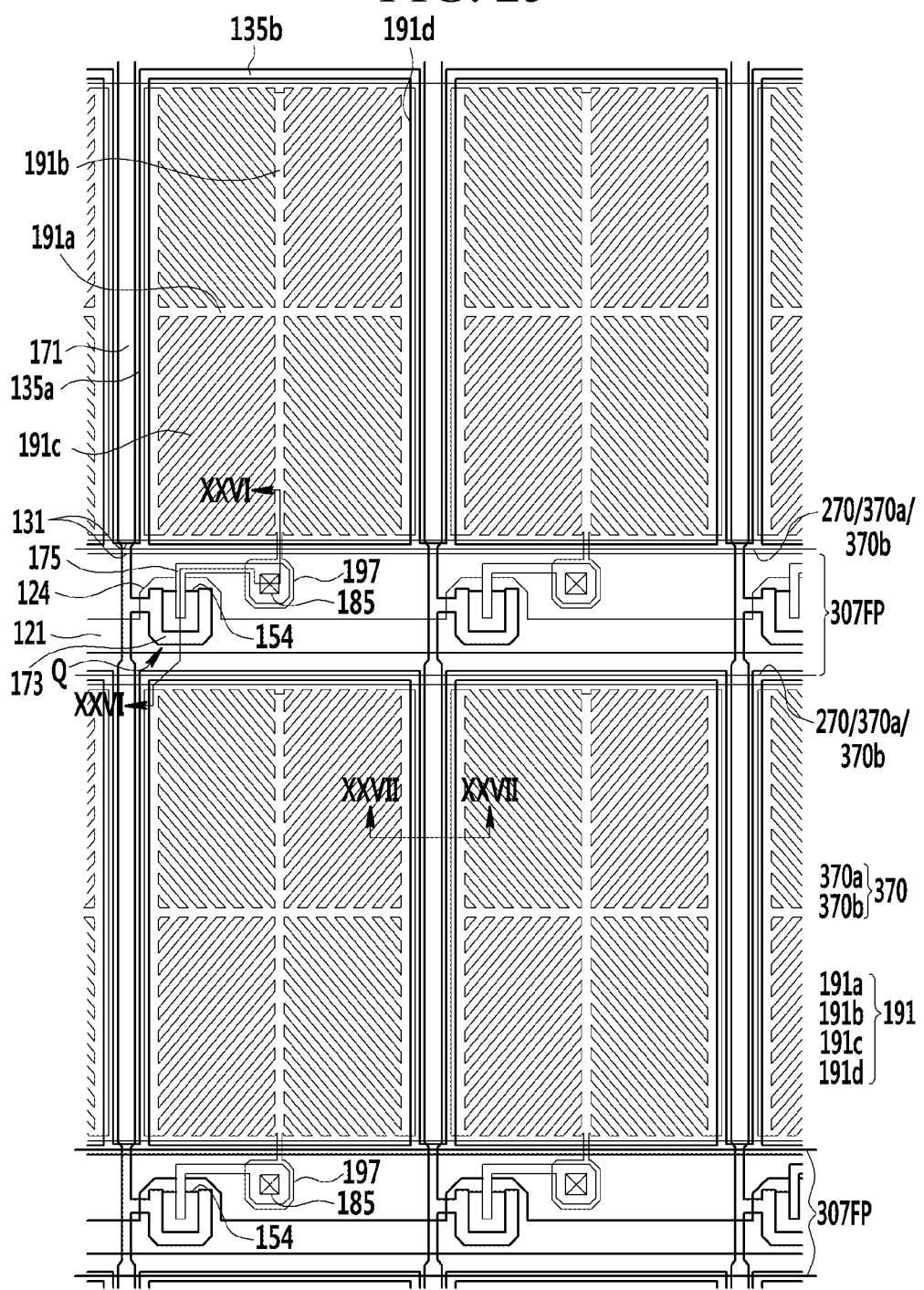
FIG. 25 is a top plan view of a liquid crystal display according to an exemplary embodiment.
Figure 26:
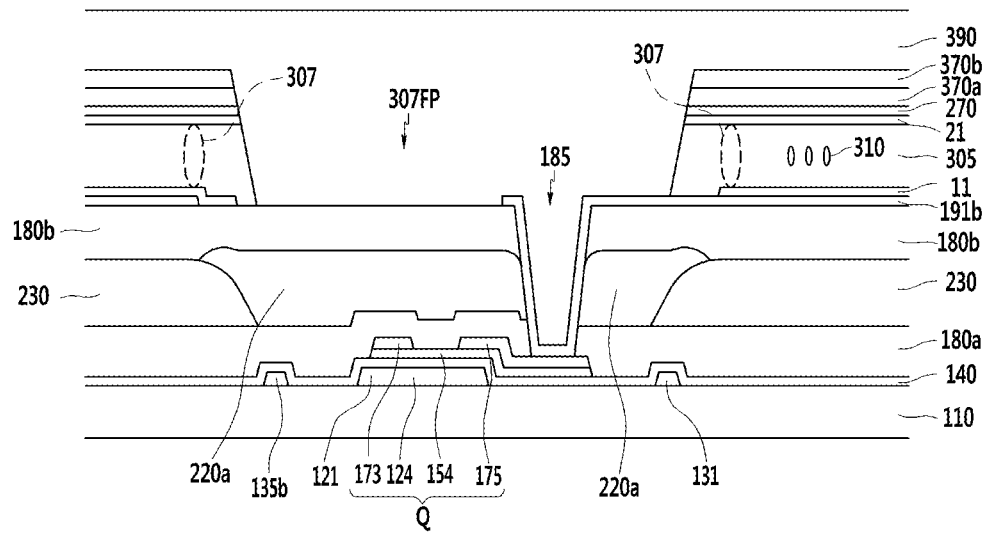
FIG. 26 is a cross-sectional view of the liquid crystal display of FIG. 25, taken along the line XXVI-XXVI.
Figure 27:
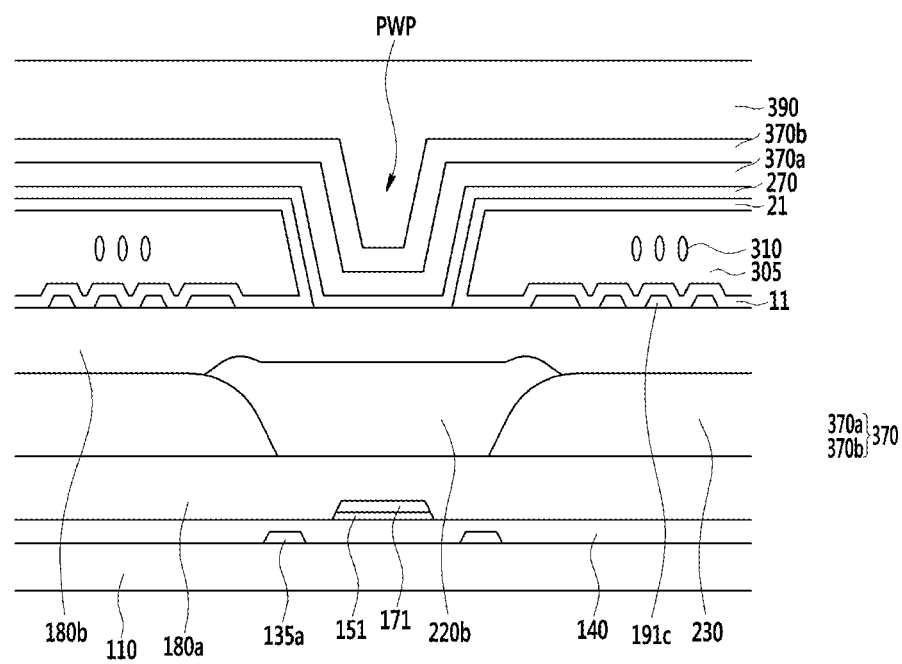
FIG. 27 is a cross-sectional view of the liquid crystal display of FIG. 25, taken along the line XXVII-XXVII.

FIG. 25 is a top plan view of a liquid crystal display according to an exemplary embodiment. FIG. 26 is a cross-sectional view of the liquid crystal display of FIG. 25, taken along the line XXVI-XXVI. FIG. 27 is a cross-sectional view of the liquid crystal display of FIG. 25, taken along the line XXVII-XXVII.

FIG. 25 shows a 2*2 pixel, which is a part of a plurality of pixels, and such pixels may be iteratively arranged in up, down, left, and right directions in the liquid crystal display according to the exemplary embodiment.

Referring to FIG. 25 to FIG. 27, gate lines 121 and storage electrode lines 131 are formed on a substrate 110 that is made of transparent glass or plastic. The gate lines 121 include a gate electrode 124. The storage electrode lines 131 substantially extend in a horizontal direction, and transmit a constant voltage such as a common voltage Vcom. The storage electrode lines 131 include a pair of vertical portions 135a, sometimes called vertical storage electrode portions 135a, substantially extending perpendicularly to the gate line 121 and a pair of horizontal portions 135b, sometimes called horizontal storage electrode portions 135a, connecting ends of the pair of vertical portions 135a with each other. The storage electrode portions 135a and 135b may have a structure that surrounds a pixel electrode 191.

A gate insulating layer 140 is formed on the gate lines 121 and the storage electrode lines 131. A linear semiconductor layer 151 provided in a lower portion of a data line 171 and a semiconductor layer 154 provided below source/drain electrodes 173, 175 and a channel area of a thin film transistor Q are formed on the gate insulating layer 140. The linear semiconductor layer 151 and the semiconductor layer 154 that corresponds to the lower portion of the source/drain electrodes 173, 175 and the channel area may be connected with each other.

A plurality of ohmic contacts (not shown) may be formed between the linear semiconductor layer 151 and the data line 171 and between the semiconductor layer 154 that corresponds to the lower portion of the source/drain electrodes 173, 175 and the channel area and the source/drain electrodes 173, 175.

Data conductors 171, 173, and 175 including the source electrode 173, the data line 171 connected with the source electrode 173, and the drain electrode 175 are formed on each of the semiconductor layers 151 and 154 and the gate insulating layer 140.

The gate electrode 124, the source electrode 173, and the drain electrode 175 form the thin film transistor Q together with the semiconductor layer 154, and a channel of the thin film transistor Q is formed in an exposed portion of the semiconductor layer 154 between the source electrode 173 and the drain electrode 175.

A first interlayer insulating layer 180a is formed on the data conductors 171, 173, and 175 and the exposed portion of the semiconductor layer 154. The first interlayer insulating layer 180a may include an inorganic insulator such as a silicon nitride (SiNx) and a silicon oxide (SiOx), or an organic insulator.

A color filer 230 and light blocking members 220a and 220b are formed on the first interlayer insulating layer 180a.

First, the light blocking members 220a and 220b are formed in a lattice structure having an opening that corresponds to an image display area, and are made of a material which does not transmit light. The color filter 230 is formed in the opening of the light blocking members 220a and 220b. The light blocking members 220a and 220b include a horizontal light blocking member 220a formed along a direction that is parallel with the gate line 121 and a vertical light blocking member 220b formed along a direction that is parallel with the date line 171.

The color filter 230 displays one of primary colors such as three primary colors of red, green, and blue. The color filter 230 is not limited to the three primary colors of red, green, and blue, but may display cyan, magenta, yellow, and white-based colors. The color filter 230 may be made of a material displaying different colors for each pixel adjacent to each other.

A second interlayer insulating layer 180b covering the color filter 230 and the light blocking members 220a and 220b is formed on the color filter 230 and the light blocking members 220a and 220b. The second interlayer insulating layer 180b may include an inorganic insulator such as a silicon nitride (SiNx) and a silicon oxide (SiOx), or an organic insulator. Unlike as shown in FIG. 26, when a step is formed due to a thickness difference between the color filter 230 and the light blocking members 220a and 220b, the second interlayer insulating layer 180b is set to include an organic insulator so as to reduce or remove the step.

Contact holes 185 that extend to and expose the drain electrode 175 may be formed in the color filter 230, the light blocking members 220a and 220b, and the interlayer insulating layers 180a and 180b.

The pixel electrode 191 is formed on the second interlayer insulating layer 180b. The pixel electrode 191 may be made of a transparent conductive material such as ITO or IZO.

The pixel electrode 191 is formed in the shape of a quadrangle, and includes cross stem portions including horizontal stem portions 191a and vertical stem portions 191b. In addition, the pixel electrode 191 is divided into four sub-areas by the horizontal stem portions 191a and the vertical stem portions 191b, and each sub-area includes a plurality of minute stem portions 191c. Further, in the present exemplary embodiment, the pixel electrode 191 may include outer edge stem portions 191d connecting the minute stem portions 191c from right and left outer edges. In the present exemplary embodiment, the outer edge stem portions 191d are disposed in the right and left outer edges of the pixel electrode 191, but they may extend to an upper or lower portion of the pixel electrode 191.

The minute stem portions 191c of the pixel electrode 191 form an angle of about 40 degrees or 45 degrees with the gate line 121 or the horizontal stem portion 191a. In addition, the minute stem portions 191c of two neighboring sub-areas may be perpendicular to each other. Further, the width of the minute stem portions 191c may be gradually increased, or gaps between the minute stem portions 191c may be different from each other.

The pixel electrode 191 includes an extension portion 197 connected from a lower end of the vertical stem portion 191b and that has a wider area than the vertical stem portion 191b. The extension portion 197 of the pixel electrode 191 is physically and electrically connected with the drain electrode 175 through the contact hole 185, and receives a data voltage from the drain electrode 175.

The description of the thin film transistors Q and the pixel electrode 191 described above is one example, and the structure of the thin film transistors and the design of the pixel electrode may be modified to enhance side visibility.

A lower alignment layer 11 is formed on the pixel electrode 191, and the lower alignment layer 11 may be a vertical alignment layer. The lower alignment layer 11 may include at least one of materials generally used as a liquid crystal alignment layer such as polyamic acid, a polysiloxane, a polyimide, or the like. In addition, the lower alignment layer 11 may be a photo-alignment layer.

An upper alignment layer 21 is disposed in a portion that is opposite to the lower alignment layer 11, and a microcavity 305 is formed between the lower alignment layer 11 and the upper alignment layer 21. A liquid crystal material including liquid crystal molecules 310 is injected into the microcavity 305, and the microcavity 305 includes an entrance region 307. In the present exemplary embodiment, an alignment material forming the alignment layers 11 and 21 and a liquid crystal material including the liquid crystal molecules 310 may be injected into the microcavity 305 using capillary force.

The microcavity 305 may be formed as a plurality of microcavities 305 by being vertically divided by a plurality of liquid crystal injection portion 307FP provided in a portion that overlaps the gate line 121, and the plurality of microcavities 305 may be formed along a column direction, i.e., a vertical direction, of the pixel electrode 191. In addition, the microcavity 305 may be formed as a plurality of microcavities 305 by being horizontally divided by a partition wall formation portion PWP, sometimes called a partition wall portion PWP, and the plurality of microcavities 305 may be formed along a row direction of the pixel electrode 191, that is, a horizontal direction in which the gate line 121 is extended. Each of the plurality of microcavities 305 may correspond to each of the pixel areas or two or more pixel areas, and the pixel areas may correspond to the image display area.

The liquid crystal injection portion 307FP may extend along a direction in which the gate line 121 extends. The liquid crystal injection portion 307FP may vertically partition the microcavity 305, and may be an empty space where a common electrode 270 and a roof layer 370 are removed. The liquid crystal injection portion 307FP may be covered by a capping layer 390 after injection of the alignment layers 11 and 21 and the liquid crystal material that includes the liquid crystal molecules 310.

The liquid crystal injection portion 307FP may be a path for injection of an alignment material or a liquid crystal material to the microcavity 305 through the entrance region 307 by being filled with the alignment material or the liquid crystal material.

The common electrode 270 and the roof layer 370 are provided on the upper alignment layer 21. The common electrode 270 receives a common voltage, and forms an electric field with the pixel electrode 191 to which the data voltage is applied so as to determine an inclination direction of the liquid crystal molecules 310 in the microcavity 305 between the common electrode 270 and the pixel electrode 191. The common electrode 270 may be made of a transparent conductive material such as ITO or IZO. The common electrode 270 forms a capacitor with the pixel electrode 191 and maintains an applied voltage even after the thin film transistor Q is turned off.

The roof layer 370 is an inorganic insulating layer made of an inorganic material such as a silicon nitride (SiNx) or a silicon oxide (SiOx). As shown in FIG. 26 and FIG. 27, the roof layer 370 according to the exemplary embodiment may include a first inorganic layer 370a and a second inorganic layer 370b provided on the first inorganic layer 370a. The first inorganic layer 370a and the second inorganic layer 370b may have different stresses. For example, the first inorganic layer 370a may have a compressive stress and the second inorganic layer 370b may have a tensile stress. Alternatively, the first inorganic layer 370a may have a tensile stress and the second inorganic layer 370b may have a compressive stress. As in the present exemplary embodiment, the roof layer 370 has inorganic layers respectively having different stress characteristics to thereby control stress of the roof layer 370. Therefore, deformation of the roof layer 370 can be minimized.

The roof layer 370 supports a structure of the microcavity 305 for the microcavity 305 between the pixel electrode 191 and the common electrode 270 to maintain its shape. In order to support the structure of the microcavity 305, in the present exemplary embodiment, the roof layer 370 formed of only the inorganic layer(s) may have a thickness of about 4000 Å or more, and more preferably, the roof layer 370 may have a thickness between 6000 Å and 12,000 Å.

In the present exemplary embodiment, the roof layer 370 may be formed throughout the substrate 110, except for a portion that is removed from the liquid crystal injection portion 307FP.

Hereinafter, the roof layer 370 according to the exemplary embodiment will be described in detail with reference to FIG. 28 to FIG. 30.

According to the exemplary embodiment, unlike a conventional art, a process can be simplified by forming the roof layer 370 with only the inorganic layer without using an organic layer.

Figure 28:
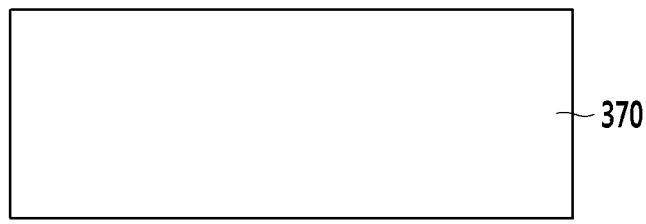
FIG. 28 is a schematic cross-sectional view of a roof layer according to an exemplary embodiment.

Referring to FIG. 28, the roof layer 370 between the common electrode 270 and the capping layer 390 can be formed of a single inorganic layer. When the roof layer 370 is formed of a single inorganic layer, an inorganic layer having a tensile stress may have a thickness of about 6000 Å or more and less than 12,000 Å.

Figure 29:
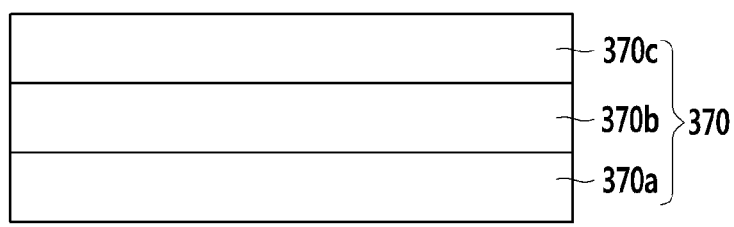
FIG. 29 is a schematic cross-sectional view illustrating the roof layer according to an exemplary embodiment.

Referring to FIG. 29, a first inorganic layer 370a, a second inorganic layer 370b, and a third inorganic layer 370c are sequentially layered such that the roof layer 370 is formed. In this case, the first inorganic layer 370a may have a compressive stress, the second inorganic layer 370b may have a tensile stress, and the third inorganic layer 370c may have a compressive stress. Alternatively, the first inorganic layer 370a may have a tensile stress, the second inorganic layer 370b may have a compressive stress, and the third inorganic layer 370c may have a tensile stress. In other words, the first inorganic layer 370a and the third inorganic layer 370c may have the same type of stress in the present exemplary embodiment.

Although it is exemplarily illustrated that the roof layer 370 has a three-layered structure in the present exemplary embodiment, this is not restrictive. Inorganic layers each having a different type of stress may be alternatively layered such that the roof layer 370 may be formed.

Figure 30:
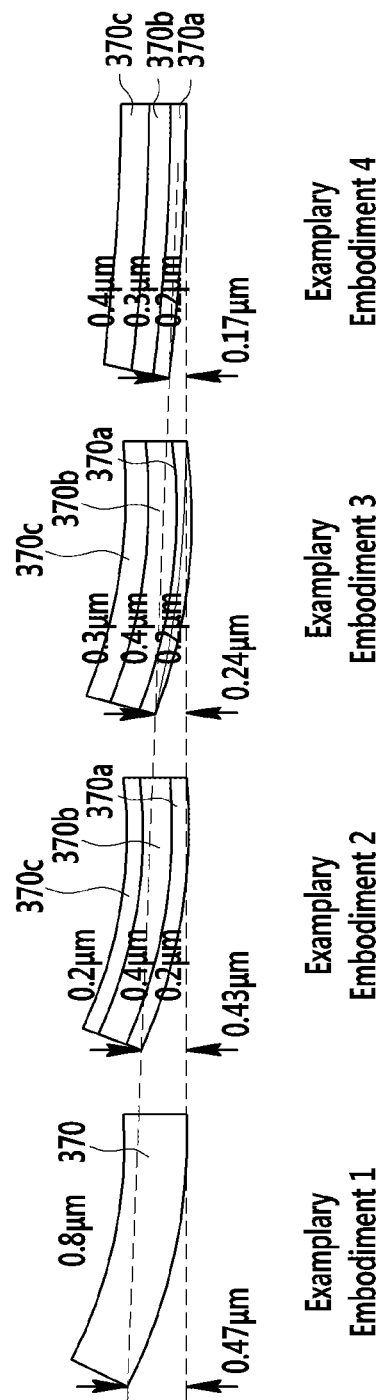
FIG. 30 shows the degree of lift of a roof layer around an entrance region according to a thickness variation according to exemplary embodiments.

FIG. 30 shows the degree of lift of the roof layer around an entrance region according to a thickness variation according to exemplary embodiments. In FIG. 30, the thicknesses marked by the arrows indicate portions where the roof layers 370 are lifted at a location that is adjacent to the liquid crystal injection portion 307FP in FIG. 26.

Referring to FIG. 30, in Exemplary Embodiment 1, a single inorganic layer 370 having a tensile stress is formed with a thickness of 0.8 µm. In Exemplary Embodiment 2, a first inorganic layer 370a having a compressive stress is formed with a thickness of 0.2 µm, a second inorganic layer 370b having a tensile stress is formed with a thickness of 0.4 µm, and a third inorganic layer 370c having a compressive stress is formed with a thickness of 0.2 µm. In Exemplary Embodiment 3, a first inorganic layer 370a having a compressive stress is formed with a thickness of 0.2 µm, a second inorganic layer 370b having a tensile stress is formed with a thickness of 0.4 µm, and a third inorganic layer 370c having a compressive stress is formed with a thickness of 0.3 µm. In Exemplary Embodiment 4, a first inorganic layer 370a having a compressive stress is formed with a thickness of 0.2 µm, a second inorganic layer 370b having a tensile stress is formed with a thickness of 0.3 µm, and a third inorganic layer 370c having a compressive force is formed with a thickness of 0.4 µm.

In Exemplary Embodiment 1, an inlet is lifted by 0.47 µm. In Exemplary Embodiment 2, Exemplary Embodiment 3, and Exemplary Embodiment 4, the degree of lift of the inlet is reduced to be less than 0.45 µm when the roof layer 370 is formed by alternatingly layering inorganic layers respectively having different stress. In detail, the inlet is lifted by 0.43 µm in Exemplary Embodiment 2, the inlet is lifted by 0.24 µm in Exemplary Embodiment 3, and the inlet is lifted by 0.17 µm in Exemplary Embodiment 4. That is, inlet lift can be minimized by controlling the thickness and stress of the inorganic layers.

Referring back to FIG. 26, in the present exemplary embodiment, the side of each of the common electrode 270 and the roof layer 370 are exposed in the liquid crystal injection portion 307FP, and the exposed sides are engaged with each other. In other words, the lateral wall of the common electrode 270 and the lateral wall of the roof layer 370 are aligned.

In the present exemplary embodiment, the common electrode 270 is formed in an upper end of the microcavity 305, but the common electrode 270 may be formed in a lower portion of the microcavity 305 thereby enabling liquid crystal driving according to an in-plane switching mode in another exemplary embodiment.

Referring still to FIG. 26, the capping layer 390 is disposed on the roof layer 370. The capping layer 390 includes an organic material or an inorganic material. In the present exemplary embodiment, the capping layer 390 may contact an upper surface of the roof layer 370 formed of only inorganic layers. The capping layer 390 may be provided not only in an upper portion of the roof layer 370 but also in the liquid crystal injection portion 307FP. In this case, the capping layer 390 may cover the entrance region 307 of the microcavity 305, exposed by the liquid crystal injection portion 307FP. In the present exemplary embodiment, it is illustrated that the liquid crystal material is removed in the liquid crystal injection portion 307FP, but a residue of the liquid crystal material after injection into the microcavity 305 may remain in the liquid crystal injection portion 307FP.

As shown in FIG. 27, in the present exemplary embodiment, the partition wall formation portion PWP is formed between horizontally neighboring microcavities 305. The partition wall formation portion PWP may extend along the data line 171, and may be covered by the capping layer 390. The partition wall portion PWP may partition or define the microcavities 305 along a horizontal direction. In the present exemplary embodiment, the partition wall portion PWP structure is formed between the microcavities 305, and therefore less stress is generated even through the substrate 110 is bent, and the degree of modification of a cell gap may be significantly reduced.

Figure 31:
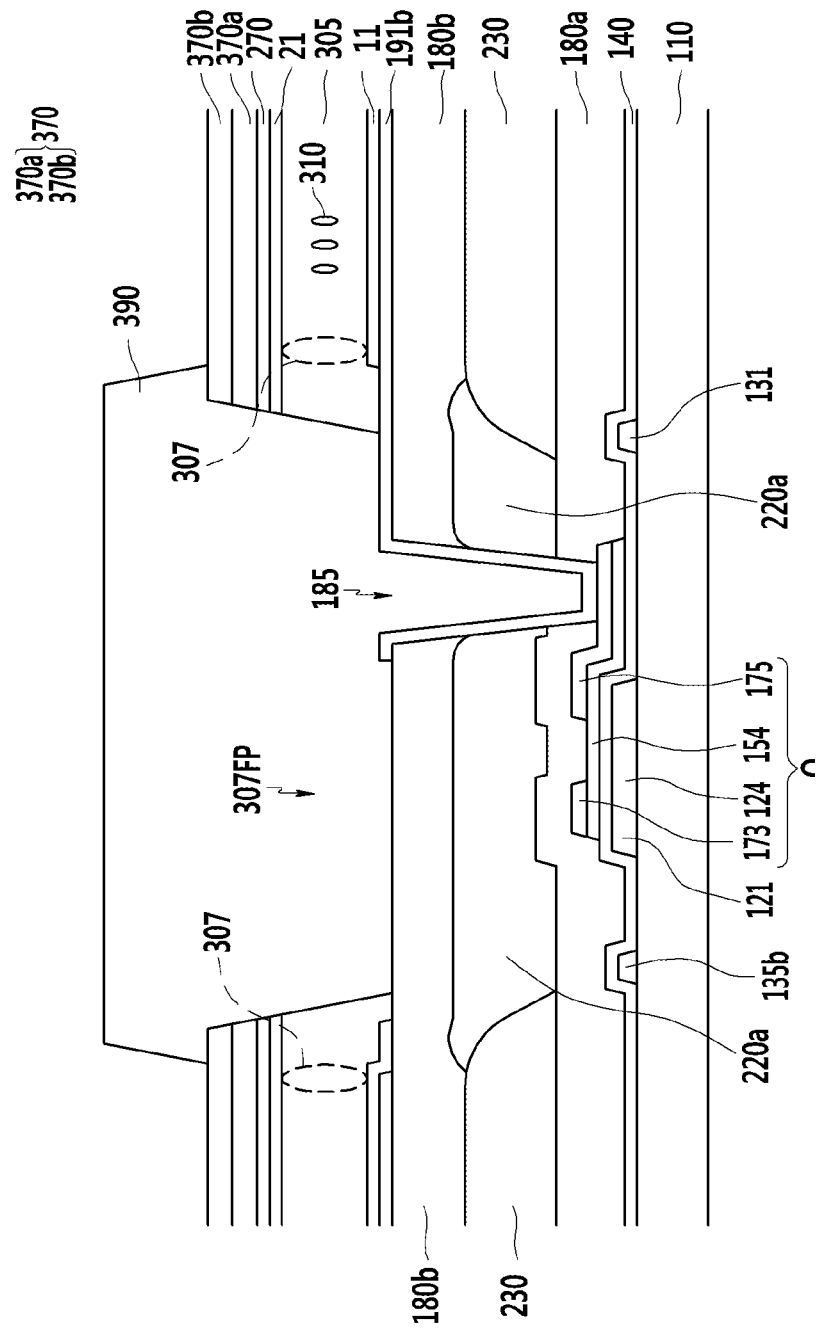
FIG. 31 and FIG. 32 are cross-sectional views of an exemplary variation of the exemplary embodiment of FIG. 26.
Figure 32:
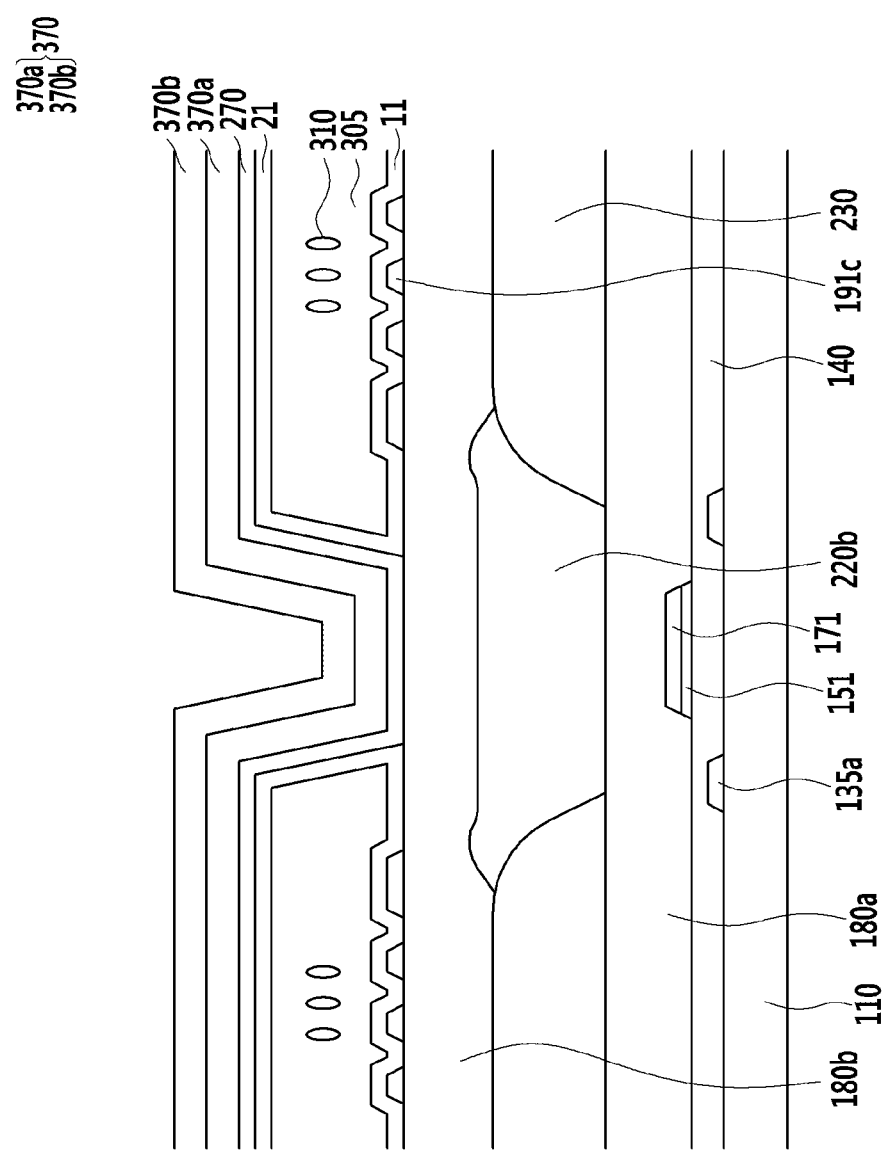

FIG. 31 and FIG. 32 are cross-sectional views of an exemplary variation of the exemplary embodiment of FIG. 26. FIG. 31 is a cross-sectional view of FIG. 25, taken along the line XXVI-XXVI, and FIG. 32 is a cross-sectional view of FIG. 25, taken along the line XXVII-XXVII.

Referring to FIG. 25, FIG. 31, and FIG. 32, the exemplary variation is similar to the exemplary embodiment of FIG. 26, except that a capping layer 390 is not formed throughout a roof layer 370 but the capping layer 390 covers a liquid crystal injection portion 307FP. In detail, the capping layer 390 is formed only in a portion corresponding to the liquid crystal injection portion 307FP, and is not formed in a portion corresponding to a pixel area. In the present exemplary embodiment, the capping layer 390 may extend along a direction of a gate line 121.

Hereinafter, an exemplary embodiment of a method for manufacturing the above-stated liquid crystal display will be described with reference to FIG. 33 to FIG. 41. The exemplary embodiment to be described below is an exemplary embodiment of the manufacturing method and may be modified in another form.

FIG. 33 to FIG. 41 are cross-sectional views of a manufacturing method of the liquid crystal display according to an exemplary embodiment.

FIG. 33, FIG. 35, FIG. 37, FIG. 38, and FIG. 40 sequentially illustrate cross-sectionals views of the liquid crystal display of FIG. 25, taken along the line XXVI-XXVI. FIG. 34, FIG. 36, FIG. 39, and FIG. 41 are cross-sectional views of the liquid crystal display of FIG. 25, taken along the line XXVII-XXVII.

Figure 33:
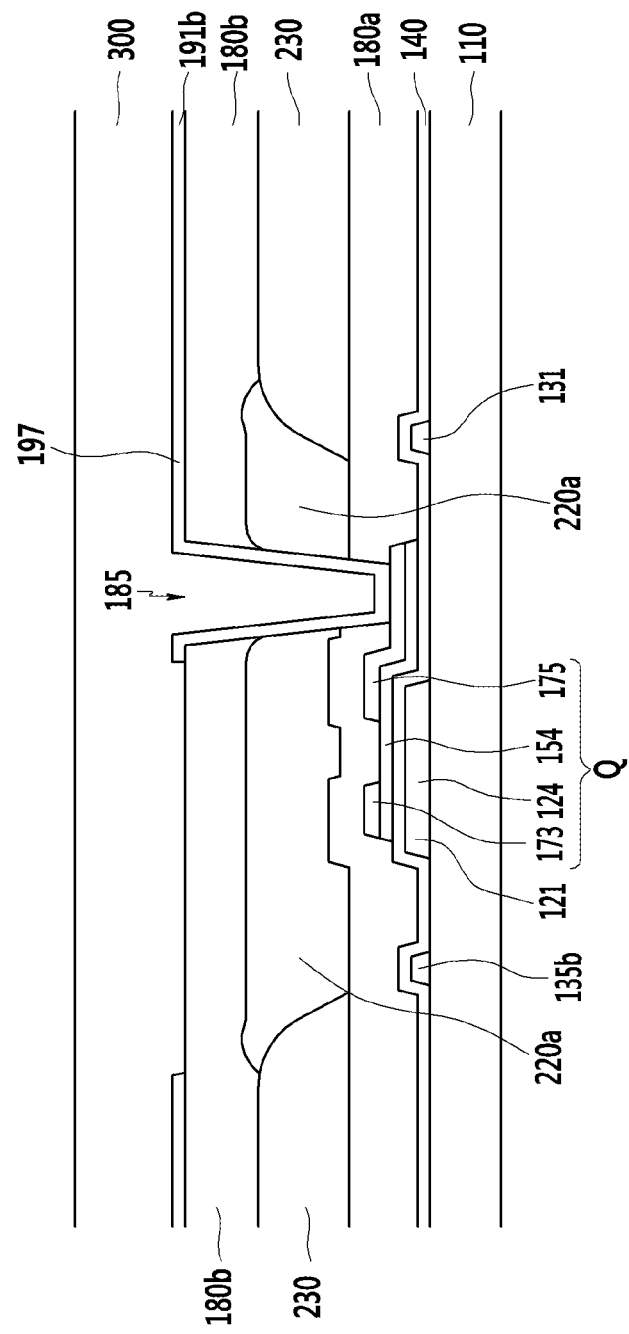
FIGS. 33, 34, 35, 36, 37, 38, 39, 40, 41 are cross-sectional views of a method for manufacturing a liquid crystal display according to an exemplary embodiment.
Figure 34:
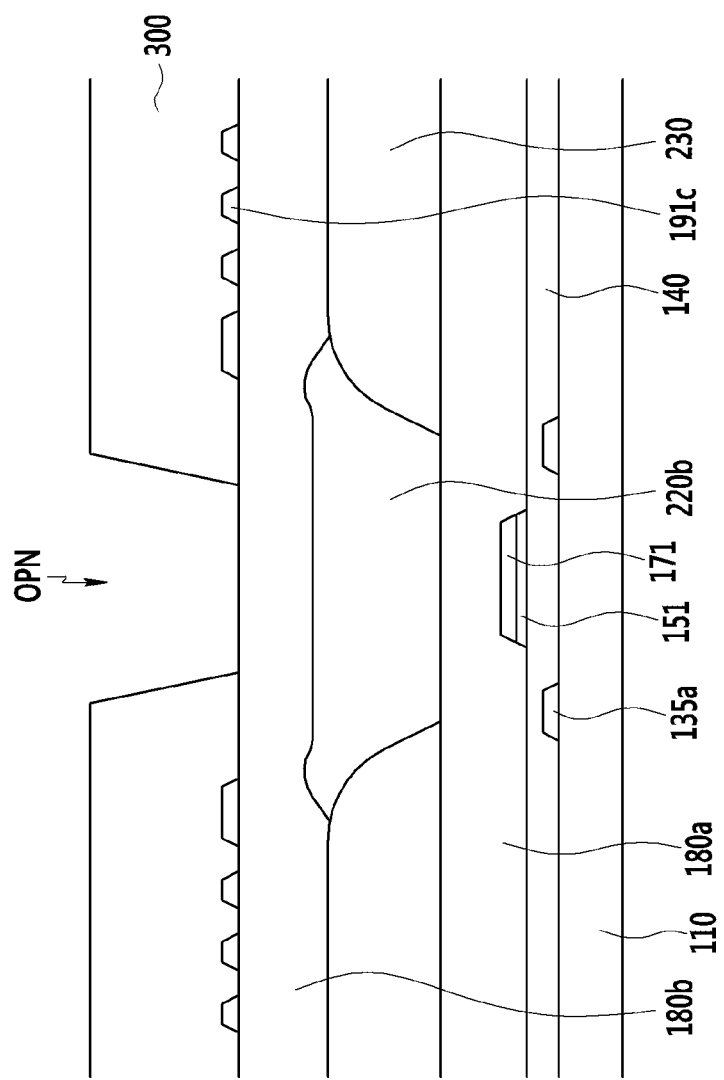

Referring to FIG. 25, FIG. 33, and FIG. 34, gate lines 121 extending in a horizontal direction for forming a generally-known switching element, a gate insulating layer 140 formed on the gate line 121, semiconductor layers 151 and 154 formed on the gate insulating layer 140, and a source electrode 173 and a drain electrode 175 are formed on a substrate 110. In this case, a data line 171 connected with the source electrode 173 may extend in a vertical direction while crossing the gate line 121.

A first interlayer insulating layer 180a is formed on data conductors 171, 173, and 175 including the source electrode 173, the drain electrode 175, and the data line 171, and the exposed semiconductor 154.

A color filter 230 is formed corresponding to a pixel area on the first interlayer insulating layer 180a, and light blocking members 220a and 22b are formed between color filters 230. The light blocking members 220a and 220b include a horizontal light blocking members 220a formed in a direction parallel with the gate line 121 and a vertical light blocking member 220b formed in a direction parallel with the data line 171.

A second interlayer insulating layer 180b covering the color filter 230 and the light blocking members 220a and 220b is formed thereon, and the second interlayer insulating layer 180b includes a contact hole 185 for physically and electrically connecting the pixel electrode 191 and the drain electrode 175.

Next, the pixel electrode 191 is formed on the second interlayer insulating layer 180b and a sacrificial layer 300 is formed on the pixel electrode 191. As shown in FIG. 34, an open portion OPN is formed on the data line 171 in the sacrificial layer 300. The open portion OPN may extend along the data line 171.

In a subsequent process, the common electrode 270, and the roof layer 370 are filled in the open portion OPN to form the partition wall portion PWP as described below. The common electrode 270 may be made of a transparent conductive material such as ITO or IZO. The roof layer 370 may be an inorganic insulating layer made of an inorganic material such as a silicon nitride (SiNx) or a silicon oxide (SiOx).

Figure 35:
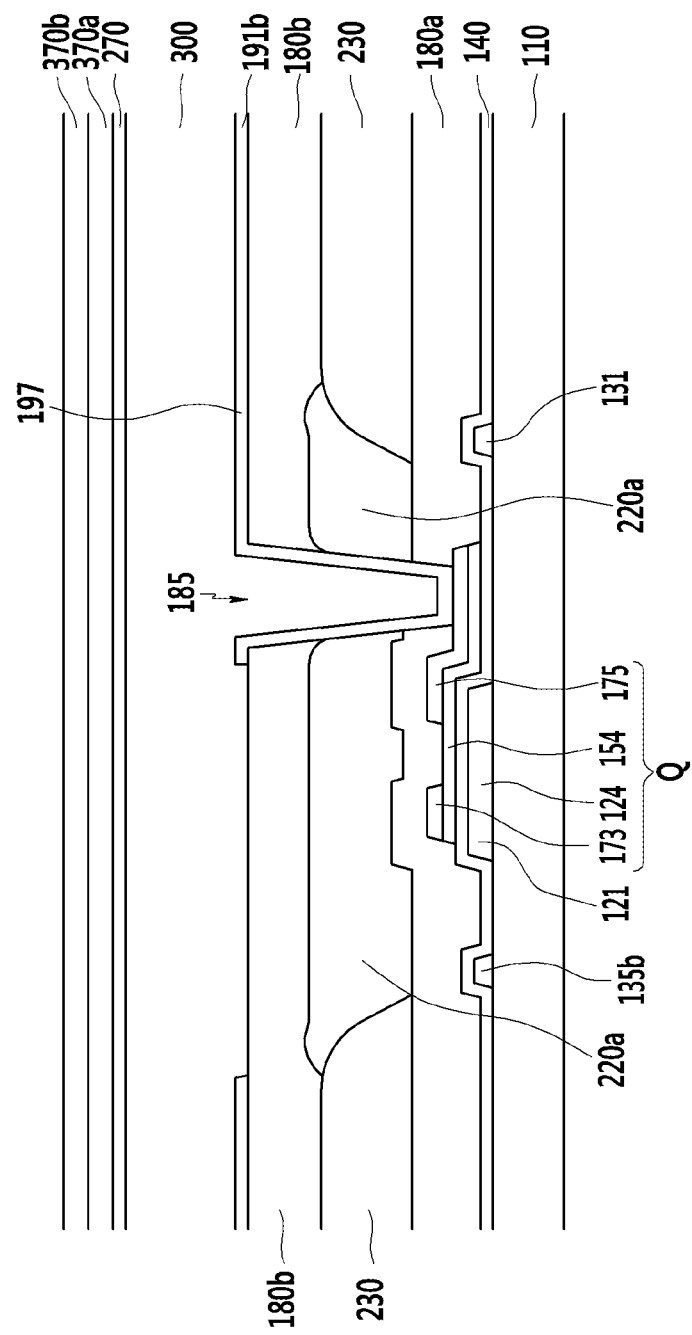
Figure 36:
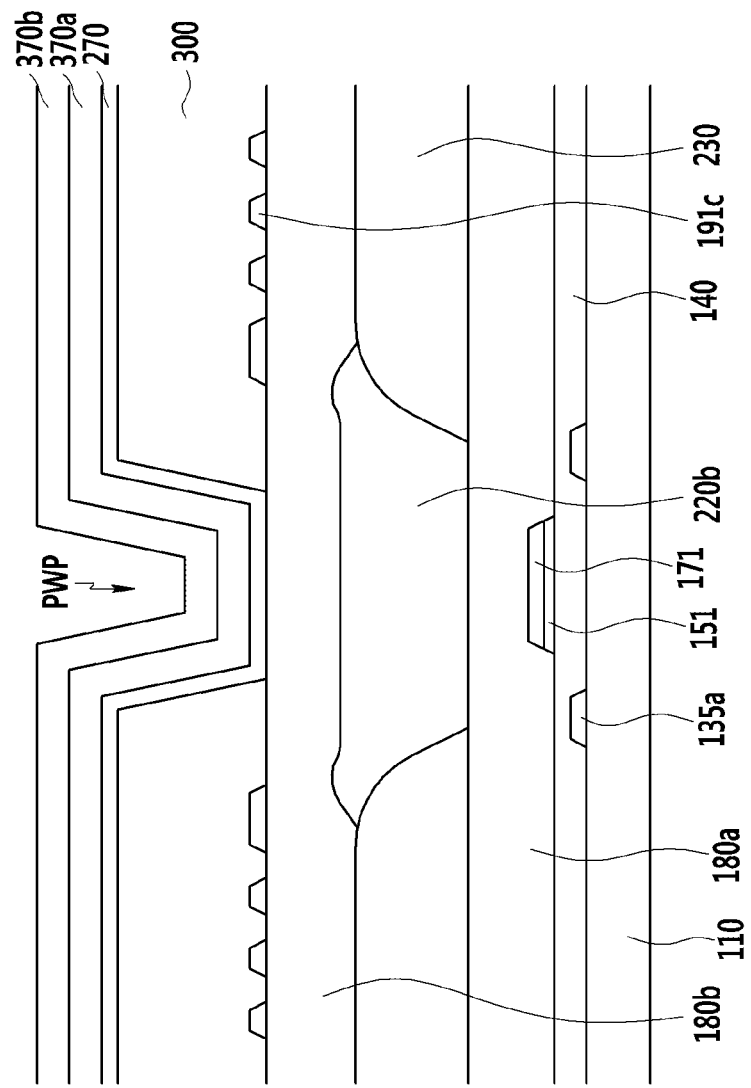

Referring to FIG. 25, FIG. 35, and FIG. 36, the common electrode 270, a first inorganic layer 370a, and a second inorganic layer 370b are sequentially layered on the sacrificial layer 300. The first inorganic layer 370a and the second inorganic layer 370b may be inorganic insulating layers made of an inorganic material such as a silicon nitride (SiNx) or a silicon oxide (SiOx). In the present exemplary embodiment, the first inorganic layer 370a and the second inorganic layer 370b may have different stresses. For example, the first inorganic layer 370a may have a compressive stress and the second inorganic layer 370b may have a tensile stress. Alternatively, the first inorganic layer 370a may have a tensile stress and the second inorganic layer 370b may have a compressive stress. Preferably, the first inorganic layer 370a and the second inorganic layer 370b may be formed of a silicon nitride such as SiNx, and a stress characteristic can be modified by controlling the amount of injection of hydrogen gas when forming the SiNx.

In this case, as shown in FIG. 36, the common electrode 270, the first inorganic layer 370a, and the second inorganic layer 370b may form a partition wall portion PWP at the open portion OPN of sacrificial layers 300 that neighbor each other in a horizontal direction.

Figure 37:
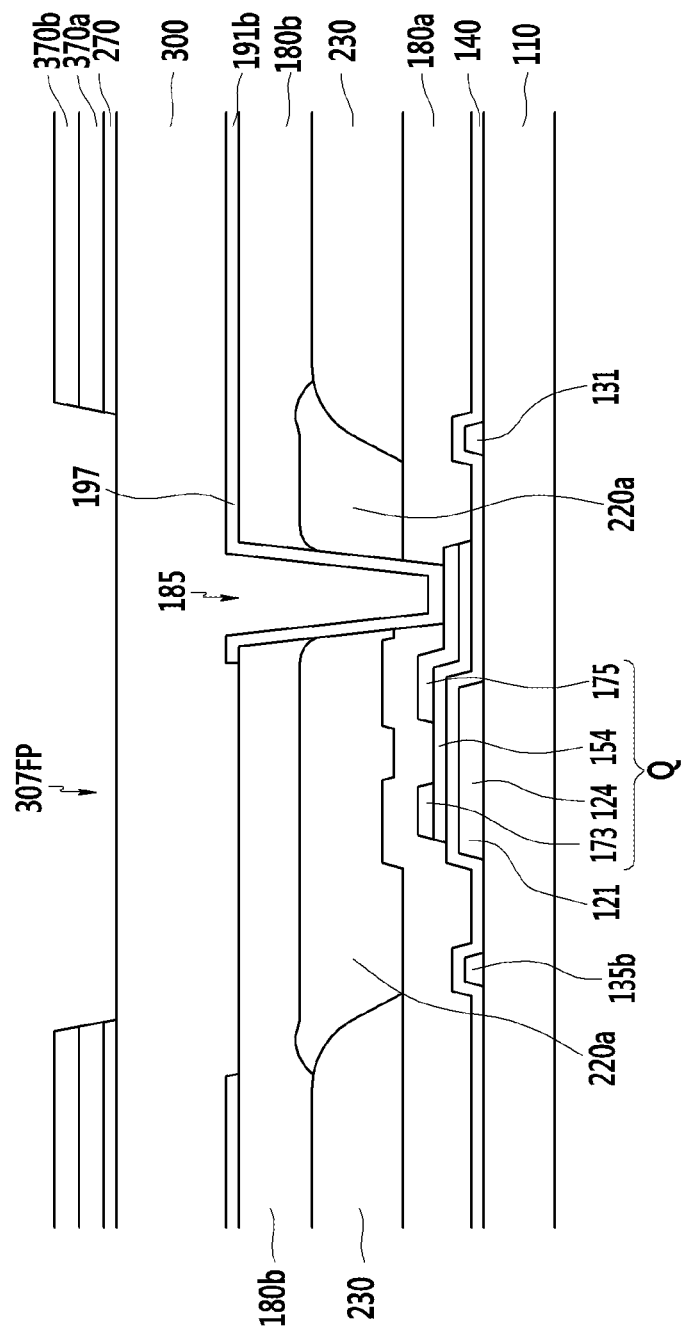

Referring to FIG. 37, the first inorganic layer 370a, the second inorganic layer 370b, and the common electrode 270 may be patterned using the same mask. The first inorganic layer 370a, the second inorganic layer 370b, and the common electrode 270 may be dry-etched. The first inorganic layer 370a, the second inorganic layer 370b, and the common electrode 270 are partially removed so that a liquid crystal injection portion 307FP is formed and thus the sacrificial layer 300 can be exposed.

Figure 38:
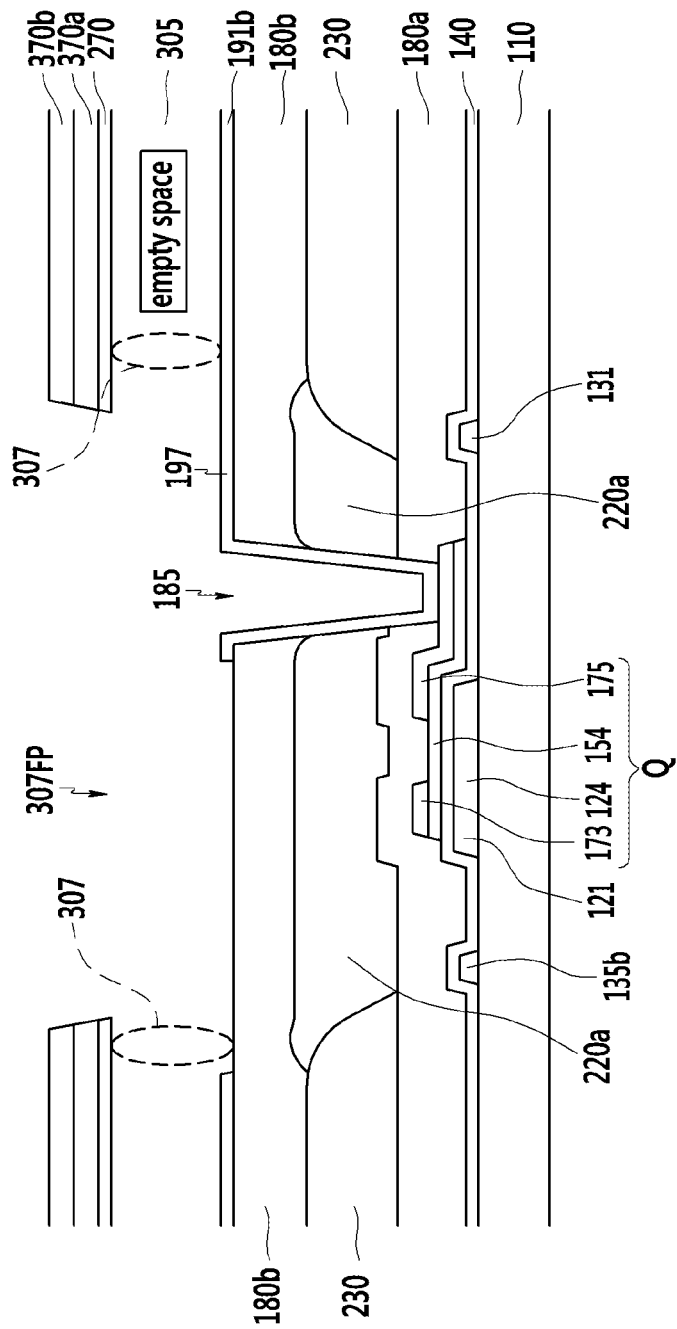
Figure 39:
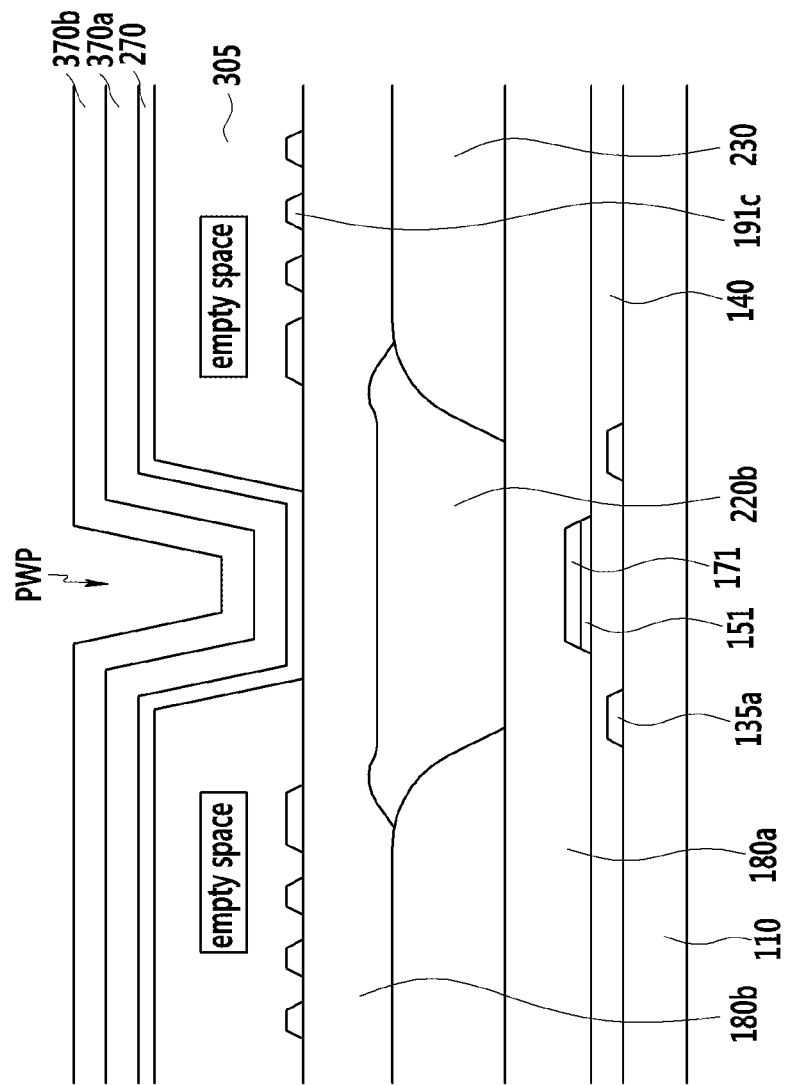

Referring to FIG. 25, FIG. 38, and FIG. 39, the sacrificial layer 300 is removed through an oxygen ($O_2$) ashing process or a wet-etching process through the liquid crystal injection portion 307FP. In this case, microcavities 305 having entrance regions 307 are formed. The microcavity 305 is an empty space because the sacrificial layer 300 is removed.

Figure 40:
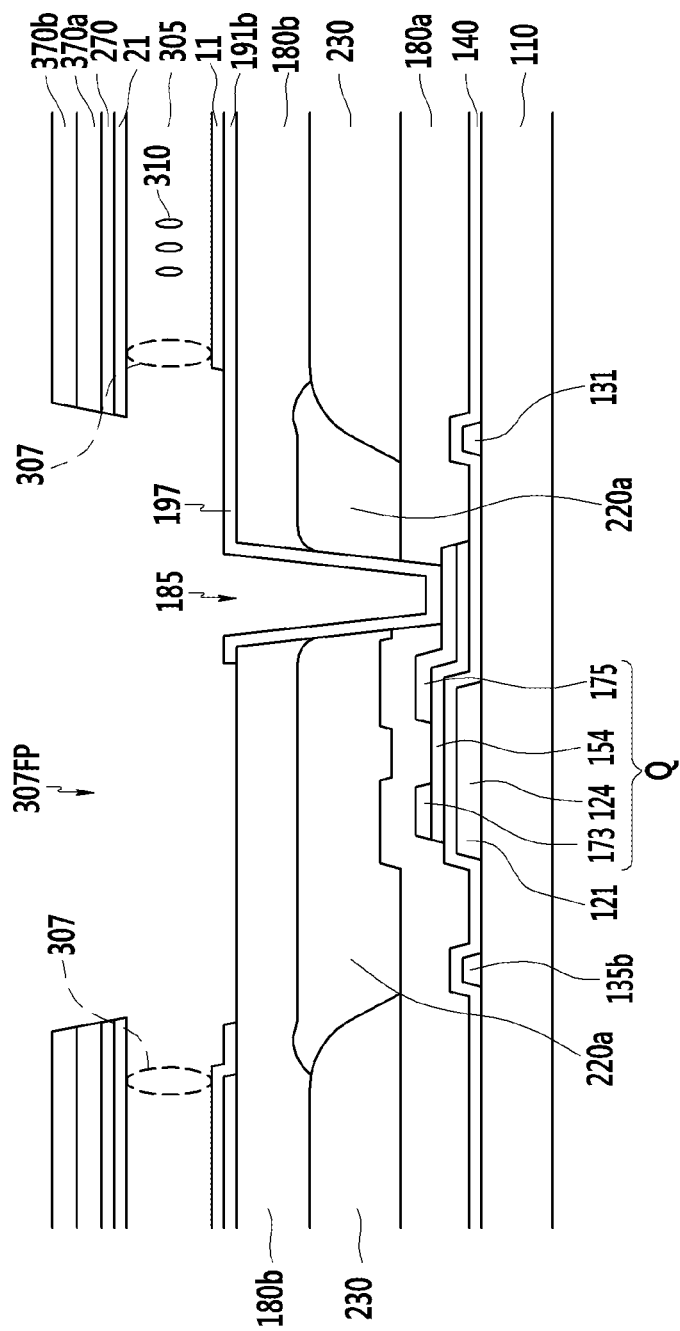
Figure 41:
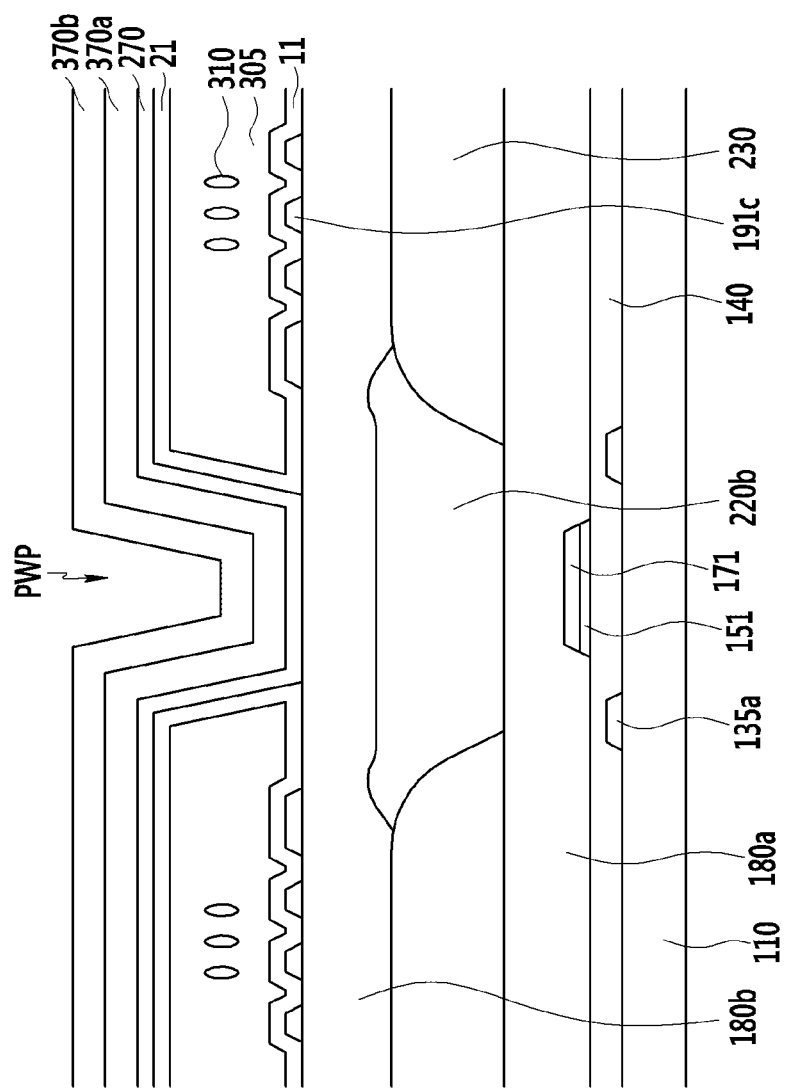

Referring to FIG. 25, FIG. 40, and FIG. 41, an alignment material is injected through the liquid crystal injection portion 307FP and the entrance region 307 to form alignment layers 11 and 21 on the pixel electrode 191 and the common electrode 270. In detail, a hake process is performed after injecting the aligning material including a solid and a solvent through the entrance region 307.

Next, the liquid crystal material including the liquid crystal molecules 310 is injected into the microcavity 305 through the entrance region 307 by using an inkjet method and the like.

Thereafter, the capping layer 390 is formed on the roof layer 370 to cover the entrance region 307 and the liquid crystal injection portion 307FP to form the liquid crystal display illustrated in FIGS. 26 and 27.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

| <Description of Symbols> | | | |
|---|---|---|---|
| 300 | sacrificial layer | 305 | microcavity |
| 307 | entrance region | 307FP | liquid crystal injection portion |
| 350 | insulating layer | 360 | organic layer |
| 360w | partition | 390 | capping layer |

What is claimed is:

1. A liquid crystal display comprising:
a substrate;
a thin film transistor disposed on the substrate;
a pixel electrode connected to the thin film transistor;
an insulating layer disposed to face the pixel electrode;
a liquid crystal layer comprising liquid crystal molecules disposed in a plurality of microcavities between the pixel electrode and the insulating layer;
a roof layer disposed on the insulating layer; and
a plurality of partitions between the microcavities adjacent to each other,
wherein the partitions are disposed between the insulating layer and the roof layer,
wherein the partitions comprise an organic material and are arranged side by side to one another, and
wherein the roof layer contacts the insulating layer in a region corresponding to the microcavities.

2. The liquid crystal display of claim 1, wherein the roof layer and the insulating layer comprise an inorganic material.

3. The liquid crystal display of claim 2, further comprising a capping layer disposed on a liquid crystal injection portion,
wherein the liquid crystal injection portion is formed between the microcavities.

4. The liquid crystal display of claim 3, further comprising a common electrode disposed under the insulating layer and facing the pixel electrode with respect to the microcavities,
wherein a lateral wall of the common electrode and a lateral wall of the insulating layer are aligned at the liquid crystal injection portion.

5. The liquid crystal display of claim 1, further comprising a data line connected to the thin film transistor, and the partitions extend in a direction parallel to the data line.

6. The liquid crystal display of claim 5, wherein the partitions are disconnected according to the direction of the data line.

7. The liquid crystal display of claim 6, further comprising a gate line disposed on the substrate and crossing the data line, and
the partitions do not cross the gate line.

8. The liquid crystal display of claim 1, wherein the partitions have a bar shape.

9. The liquid crystal display of claim 1, wherein the insulating layer is thinner than the roof layer.

* * * * *